US 7,868,701 B2

(12) United States Patent
Nakamura et al.

(10) Patent No.: US 7,868,701 B2
(45) Date of Patent: Jan. 11, 2011

(54) TRANSIMPEDANCE AMPLIFIER

(75) Inventors: Makoto Nakamura, Tokyo (JP);
Yohtaro Umeda, Tokyo (JP); Jun Endou, Tokyo (JP); Yuji Akatsu, Tokyo (JP); Yuuki Imai, Tokyo (JP); Masatoshi Tobayashi, Tokyo (JP); Yoshikazu Urabe, Tokyo (JP); Hatsushi Iizuka, Tokyo (JP); Eiji Hyodo, Tokyo (JP)

(73) Assignees: Nippon Telephone and Telegraph Corporation, Tokyo (JP); NTT Electronics Corporation, Tokyo (JP)

( * ) Notice: Subject to any disclaimer, the term of this patent is extended or adjusted under 35 U.S.C. 154(b) by 435 days.

(21) Appl. No.: 11/658,688

(22) PCT Filed: Aug. 3, 2005

(86) PCT No.: PCT/JP2005/014211

§ 371 (c)(1),
(2), (4) Date: Sep. 2, 2008

(87) PCT Pub. No.: WO2006/013893

PCT Pub. Date: Feb. 9, 2006

(65) Prior Publication Data

US 2008/0309407 A1 Dec. 18, 2008

(30) Foreign Application Priority Data

| Aug. 3, 2004 | (JP) | ............................. 2004-226857 |
| Apr. 27, 2005 | (JP) | ............................. 2005-129199 |
| Apr. 27, 2005 | (JP) | ............................. 2005-129203 |

(51) Int. Cl.
*H03F 3/08* (2006.01)

(52) U.S. Cl. .................. 330/308; 250/214 A

(58) Field of Classification Search .................. 330/59, 330/308; 250/214 A, 214 AG
See application file for complete search history.

(56) References Cited

U.S. PATENT DOCUMENTS 5,790,295 A * 8/1998 Devon .......................... 330/308

(Continued)

FOREIGN PATENT DOCUMENTS

JP     56-154810 A    11/1981

(Continued)

OTHER PUBLICATIONS

Nakamura, M., et al.; "*A 1.25Gbit/s Burst Mode Pre-amplifier IC with Quick Response for PON Systems*"; NTT Photonics Laboratories, NTT Corporation; Feb. 26, 2006.

(Continued)

*Primary Examiner*—Khanh V Nguyen
(74) *Attorney, Agent, or Firm*—Blakely, Sokoloff, Taylor & Zafman

(57) ABSTRACT

A gain switching determination circuit (250) compares/determines a comparative input voltage (Vc) from an inter-stage buffer (230) with a first hysteresis characteristic, and outputs a gain switching signal (SEL) based on the comparison/determination result to first and second transimpedance amplifier core circuits (210, 220), thereby switching the gains of the core circuits. This obviates holding a comparison input voltage with long response time in a level holding circuit for gain switching determination, which allows instantaneous gain switching determination and instantaneous response corresponding to burst data.

18 Claims, 25 Drawing Sheets

U.S. PATENT DOCUMENTS 7,406,268 B2 * 7/2008 Schrodinger ............ 330/308

FOREIGN PATENT DOCUMENTS

| | | |
|---|---|---|
| JP | 07-193437 A | 7/1995 |
| JP | 8-46444 | 2/1996 |
| JP | 09246880 | 9/1997 |
| JP | 11-88092 | 3/1999 |
| JP | 11-355080 | 12/1999 |
| JP | 2000-252774 A | 9/2000 |
| JP | 2001-144552 | 5/2001 |
| JP | 2001196877 | 7/2001 |
| JP | 2001217657 | 8/2001 |
| JP | 2002-217659 | 8/2002 |
| JP | 2003-142963 | 5/2003 |
| JP | 2003-283261 | 10/2003 |
| JP | 2003-332866 A | 11/2003 |
| JP | 2004363678 | 12/2004 |

OTHER PUBLICATIONS

Saruwatari et al., "156Mbps Burst Mode Optical Receiver", IEICE transactions, 1997, B-10-128.

Shuichiro Yasuhisa Handbook of Practicle Electronic Circuits (1), $10^{th}$ edition, Jun. 1, 1976 pp. 454-455.

* cited by examiner

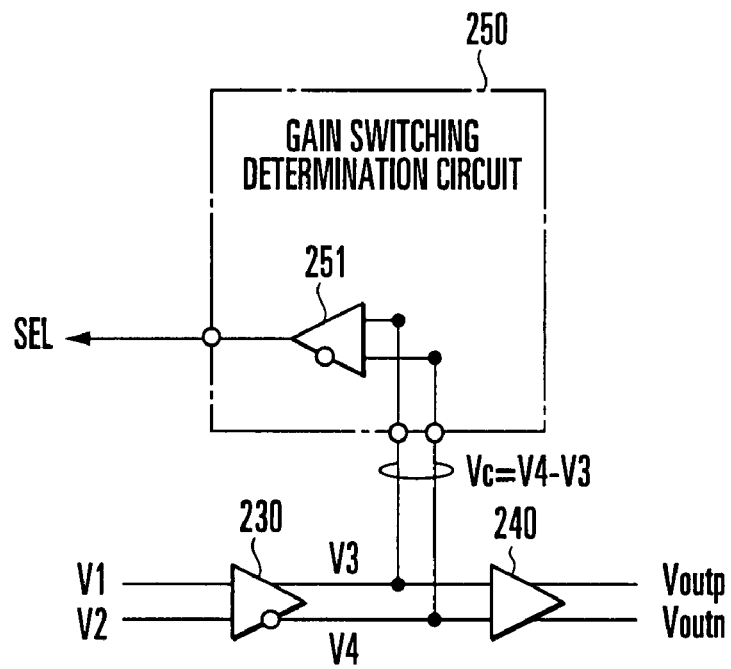
F I G. 2
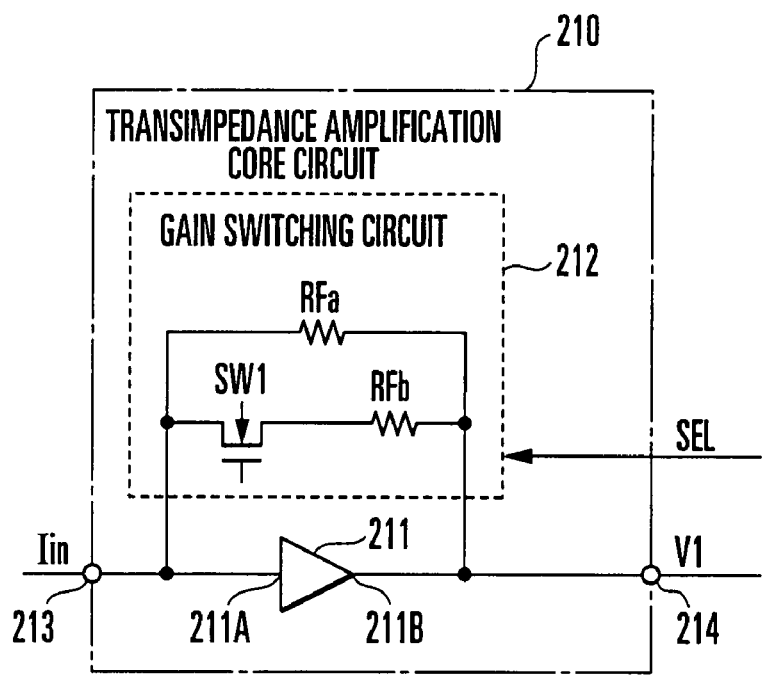
F I G. 3

|  | MN1,MN3 | MN2,MN4 |
|---|---|---|
| HIGH GAIN (INITIAL STATE) | L | L |
| INTERMEDIATE GAIN | H | L |
| LOW GAIN | H | H |

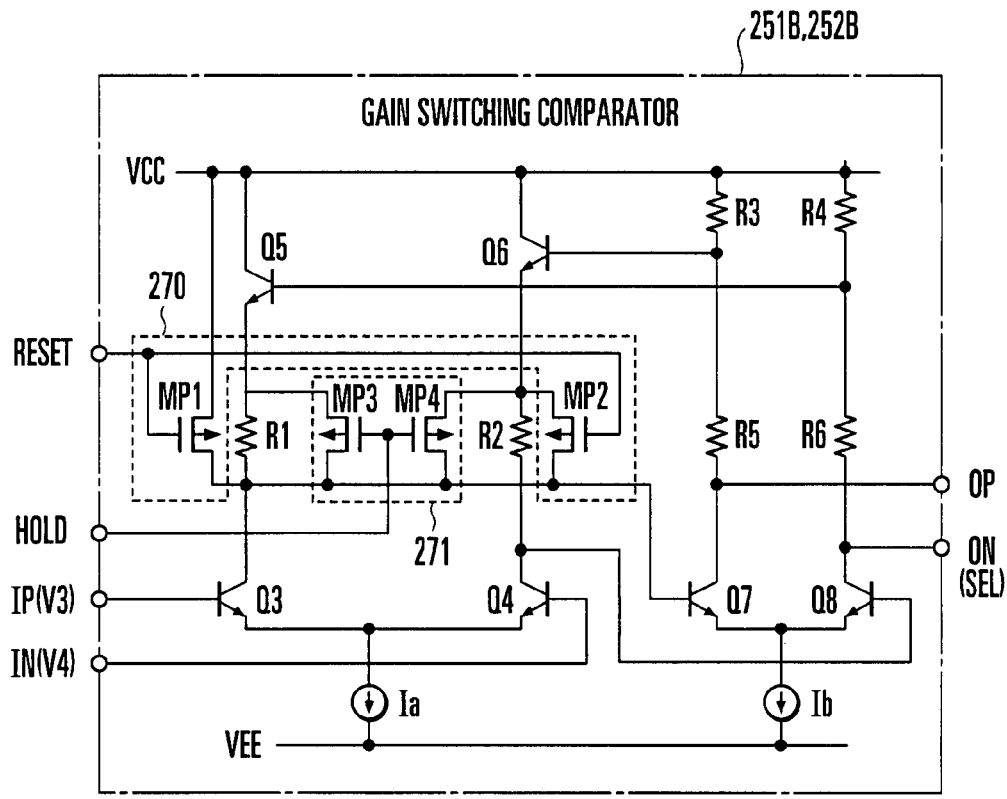
F I G. 32
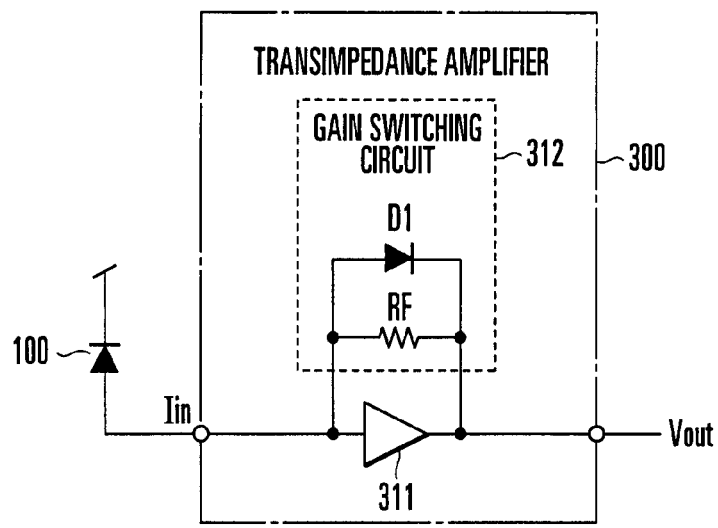
F I G. 33

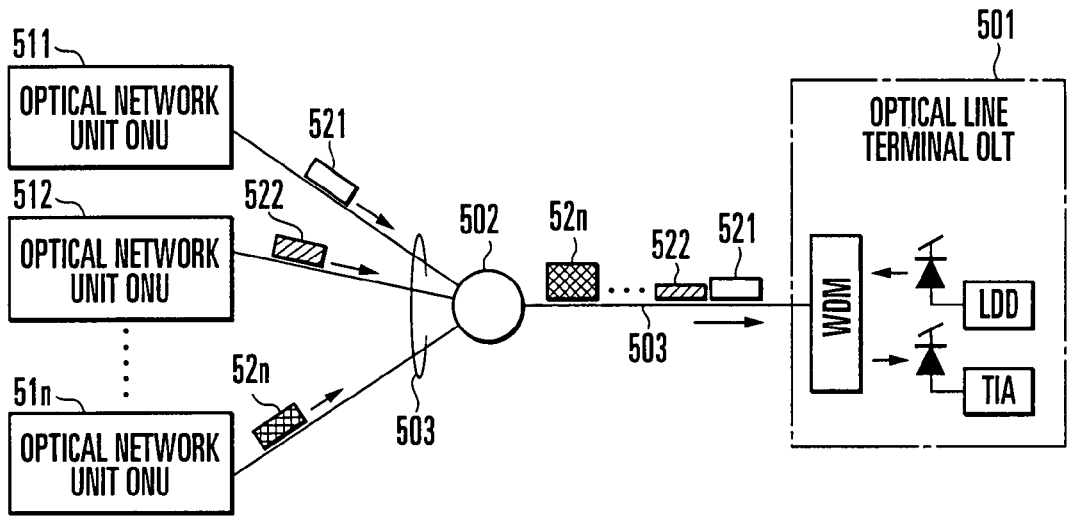
F I G. 35
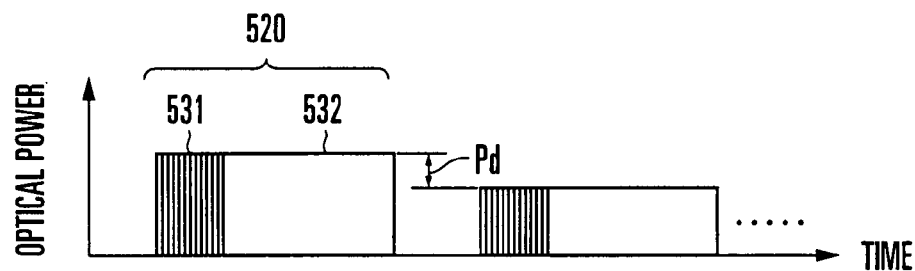
F I G. 36
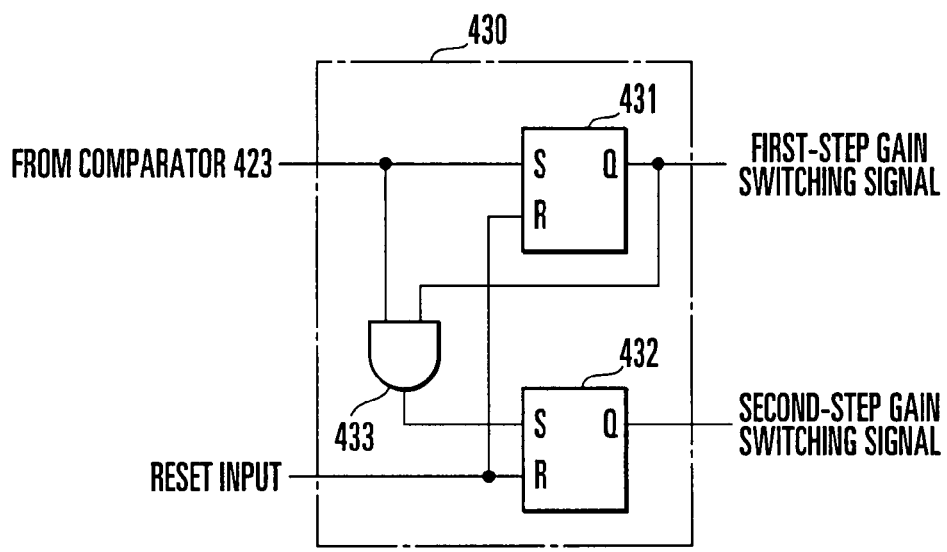
F I G. 37

TRANSIMPEDANCE AMPLIFIER

The present patent application is a non-provisional application claiming the benefit of International Application No. PCT/JP2005/014211, filed Aug. 3, 2005.

TECHNICAL FIELD

The present invention relates to a transimpedance amplifier which receives a current signal obtained by photoelectric conversion using a light-receiving element and converts/amplifies the signal into a voltage signal in an optical reception circuit and, more particularly, to a transimpedance amplifier which can cope with an input current with a large dynamic range.

BACKGROUND ART

In an optical transmission circuit in an optical transmission system, optical interconnection, passive optical network (to be referred to as a PON (Passive Optical Network) hereinafter) system, or the like which can perform high-speed data transmission, an optical reception circuit which converts an optical signal into an electrical signal uses a transimpedance amplifier.

A transimpedance amplifier receives an input current Iin obtained by photoelectrically converting a received optical signal using a light-receiving element, converts the current into an output voltage Vout by using a transimpedance gain proportional to the value of a feedback resistor, and outputs the voltage.

In a transimpedance amplifier of this type, as the input current Iin increases, the amplitude of the output voltage Vout saturates, resulting in waveform distortion. In order to satisfy both requirements for high sensitivity and wide dynamic range characteristics, therefore, a conventional transimpedance amplifier decreases a transimpedance gain by reducing the value of a feedback resistor as the input current Iin increases, thereby obtaining the output voltage Vout with small distortion even at the time of reception of a large current.

A conventional transimpedance amplifier is disclosed in reference 1 (Saruwatari, Sugawara, and Ibe, "156 Mbps Burst Mode Optical Receiver", IEICE transactions, 1997, B-10-128). As shown in FIG. 33, a transimpedance amplifier 300 is a circuit which includes an amplification circuit 311 and a gain switching circuit 312, and obtains an output voltage Vout by performing voltage conversion and signal amplification for an input current Iin output from a light-receiving element 100. The gain switching circuit 312 is configured such that a feedback resistor RF connects in parallel with a diode D1.

In the transimpedance amplifier 300, as the input current Iin increases, the voltage difference between the input terminal and output terminal of the amplification circuit 311 increases, and the diode D1 inserted in parallel with the feedback resistor RF is turned on. With this operation, since the value of the feedback resistor equivalently decreases, the transimpedance gain decreases. This makes it possible to avoid the saturation of the output voltage Vout even if a large current is input.

In addition, reference 2 (Japanese Patent Laid-Open No. 2000-252774) discloses another conventional transimpedance amplifier configured as a gain switching circuit which not only switches the values of one feedback resistor RF by turning on/off the diode but also switches/connects a plurality of feedback resistors. As shown in FIG. 34, a transimpedance amplifier 400 includes a transimpedance amplifier core circuit 410 and a gain switching determination circuit 420. The transimpedance amplifier core circuit 410 includes an amplification circuit 411 and a gain switching circuit 412, and performs voltage conversion and signal amplification for an input current Iin output from a light-receiving element 100. The gain switching determination circuit 420 controls gain switching by the gain switching circuit 412 in accordance with an output voltage Vout from the transimpedance amplifier core circuit 410.

More specifically, the gain switching circuit 412 comprises a plurality of feedback resistors whose switches connect in series. The gain switching determination circuit 420 obtains a gain switching signal SEL by monitoring the DC level of the output voltage Vout from the amplification circuit 411, and turns on/off the switch of the gain switching circuit 412 in accordance with the gain switching signal SEL, thereby switching the value of the feedback resistor.

In the case shown in FIG. 34, the gain switching determination circuit 420 comprises a high level holding circuit, low level holding circuit, and comparator 423. In this case, the high level holding circuit comprises an operational amplifier 421, capacitor C1, and diode D2, and holds the output voltage Vout from the transimpedance amplifier 400 at a high level. The low level holding circuit comprises an operational amplifier 422, capacitor C2, and diode D3, and holds the output voltage Vout at a low level. The comparator 423 performs switching determination by identifying that the potential difference between the high level and low level of the output voltage Vout which the two holding circuits hold becomes a predetermined value or more.

DISCLOSURE OF INVENTION

Problem to be Solved by the Invention

An optical transmission system which can perform high-speed data transmission, more specifically a PON system, generally must have high sensitivity, a wide input dynamic range, and burst response characteristics.

Referring to FIG. 35, the PON system comprises one OLT (Optical Line Terminal) 501 and a plurality of ONUs (Optical Network Units) 511 to 51n. The optical line terminal 501 connects to the optical network units 511 to 51n through a passive device such as an optical coupler 502 and optical fibers 503. Uplink (from ONU to OLT) data from the optical network units 511 to 51n, i.e., packets 521 to 52n, differ in optical power at the time of arrival at the optical line terminal 501 due to differences between the respective routes. For this reason, a TIA (TransImpedance Amp) used in the optical reception circuit of the optical line terminal 501 must have a wide dynamic range.

In the PON system in FIG. 35, while a given optical network unit transmits a packet (packet interval), another optical network unit cannot transmit any packet. In order to increase the transmission efficiency, it is necessary to shorten the time between packets.

As shown in FIG. 36, a specific bit called a preamble 531 is prepared for the head of a packet 520. The optical line terminal 501 uses the preamble 531 for packet synchronization. Performing packet synchronization with the short preamble 531 and receiving a succeeding payload 532 make it possible to increase the transmission efficiency.

As described above, the packets 520 differ in signal amplitude due to a difference Pd in optical power between the packets at the time of arrival at the optical line terminal 501. In order to increase the transmission efficiency, it is necessary to perform packet synchronization with the short preamble 531 and receive the succeeding payload 532. This makes it necessary to use an optical reception circuit which can instantaneously switch gains with the short preamble 531. For this purpose, the optical reception circuit needs a transimpedance amplifier which is capable of instantaneous response and has a wide dynamic range.

However, according to the above conventional techniques, e.g., the conventional transimpedance amplifier 300 described with reference to FIG. 33, since the diode D1 is inserted in parallel with the feedback resistor RF, when the input current Iin increases, the DC transmission characteristics of the output voltage Vout greatly distort, resulting in a deterioration in the duty characteristic of the waveform of the output voltage Vout. As the duty characteristic deteriorates, a digital error occurs to cause a deterioration in transmission characteristics.

The conventional transimpedance amplifier 400 described with reference to FIG. 34 can solve the problem of the distortion of DC transmission characteristics. When the gain switching determination circuit 420 determines gain switching, it needs to hold the high level and low level of the output voltage Vout from the transimpedance amplifier 400, and hence takes much time to hold the levels, resulting in a deterioration in instantaneous response characteristic. That is, in order to ensure holding characteristics, it is necessary to make the capacitors C1 and C2 have large capacitances. In this case, since it takes much time to charge the capacitors C1 and C2, instantaneous response is difficult to realize. In addition, incorporating the capacitors C1 and C2 in an LSI will increase the layout area.

In order to achieve a wide dynamic range with high sensitivity, when the number of feedback resistors of the gain switching circuit 412 increases by two or more, it is necessary to grasp a gain state by using a gain switching determination algorithm. As circuit configuration complexity increases, the instantaneous response characteristic deteriorates. As an example of a circuit for grasping a gain state, for example, a holding circuit 430 shown in FIG. 37 is known, which holds a state by a logic circuit using SR latch circuits 431 and 432 and an AND circuit 433.

In addition, a transimpedance amplifier needs to perform gain switching at high speed and have stability in the gain switching operation.

The gain switching determination circuit 420 in FIG. 34 always compares the amplitude of the output voltage Vout from the transimpedance amplifier 400 with one reference by using the operational amplifier 421, diode D2, operational amplifier 422, and diode D3, and controls switching of the gain switching circuit 412 in accordance with the comparison result.

For this reason, according to the conventional transimpedance amplifier 400, when, for example, noise mixes with the input current Iin, the gain switching circuit 412 malfunctions due to the noise and performs gain switching, resulting in an unstable output amplitude. In the interval of the payload 532 following the preamble 531 of the packet 520 shown in FIG. 36, in particular, when gain switching occurs due to noise, since gain switching occurs in spite of no change in the input current Iin, the output voltage Vout changes. This sometimes makes it impossible to normally receive the data bit of the payload 532.

As described above, a conventional transimpedance amplifier designed to achieve a wide input dynamic range with high sensitivity has the problem that it cannot achieve instantaneous response corresponding to burst data.

In addition, this transimpedance amplifier has the problem that it is difficult to obtain stability in gain switching operation, more specifically, operation stability with respect to noise.

Means of Solution to the Problem

The present invention has been made to solve such problems, and has as its object to provide a transimpedance amplifier which can achieve high sensitivity and a wide dynamic range and achieve instantaneous response corresponding to burst data.

It is another object of the present invention to provide a transimpedance amplifier which can achieve stability in gain switching operation, more specifically, operation stability with respect to noise.

In order to achieve the above objects, according to the present invention, there is provided a transimpedance amplifier characterized by comprising a first transimpedance amplifier core circuit which includes an input terminal and an output terminal, amplifies a current input to the input terminal with a desired gain, and outputs the signal as a voltage signal from the output terminal, a second transimpedance amplifier core circuit which has the same arrangement as that of the first transimpedance amplifier core circuit with an open input terminal, an inter-stage buffer circuit which differentially amplifies voltage signals output from the first transimpedance amplifier core circuit and the second transimpedance amplifier core circuit and outputs the signals as a differential output signal, and a gain switching determination circuit which receives the differential output signal output as a comparative input voltage from the inter-stage buffer circuit, and outputs a gain switching signal for switching gains of the first transimpedance amplifier core circuit and the second transimpedance amplifier core circuit on the basis of a result obtained by comparing/determining the comparative input voltage with a first hysteresis characteristic, wherein the first transimpedance amplifier core circuit and the second transimpedance amplifier core circuit switch gains on the basis of the gain switching signal output from the gain switching determination circuit.

Effects of the Invention

According to the present invention, gain switching signals are output to the first and second transimpedance amplifier core circuits on the basis of the result obtained by comparing/determining a comparative input voltage as a differential output signal from the inter-stage buffer circuit with the first hysteresis characteristic, thereby performing the gain switching operation of switching the gains of the respective circuits. The present invention uses a hysteresis characteristic for determining on the basis of a comparative input voltage whether it is necessary to switch the gains, and hence need not hold any comparative input voltage for gain switching determination by using a level holding circuit with a slow response time. This makes it possible to instantaneously perform gain switching determination on the basis of a comparative input voltage which changes in accordance with an input current and achieve instantaneous response corresponding to burst data.

BRIEF DESCRIPTION OF DRAWINGS

FIG. 2 is a block diagram showing the arrangement of a gain switching determination circuit;

FIG. 3 is a circuit diagram showing the arrangement of a first transimpedance amplifier core circuit;

FIG. 32 is a circuit diagram showing an example of the arrangement of a gain switching comparator used in the gain switching determination circuit of a transimpedance amplifier according to the 10th embodiment of the present invention;

FIG. 33 is a circuit diagram showing the basic arrangement of a conventional transimpedance amplifier;

FIG. 35 is a block diagram showing the arrangement of a general PON system;

FIG. 36 is a view showing an example of the arrangement of a packet transmitted as uplink data in a general PON system; and FIG. 37 is a circuit diagram showing an example of the arrangement of a holding circuit which a conventional transimpedance amplifier uses.

BEST MODE FOR CARRYING OUT THE INVENTION

The embodiments of the present invention will be described next with reference to the accompanying drawings.

First Embodiment

The arrangement of a transimpedance amplifier according to the first embodiment of the present invention will be described with reference to FIGS. 1 and 2.

Figure 1:
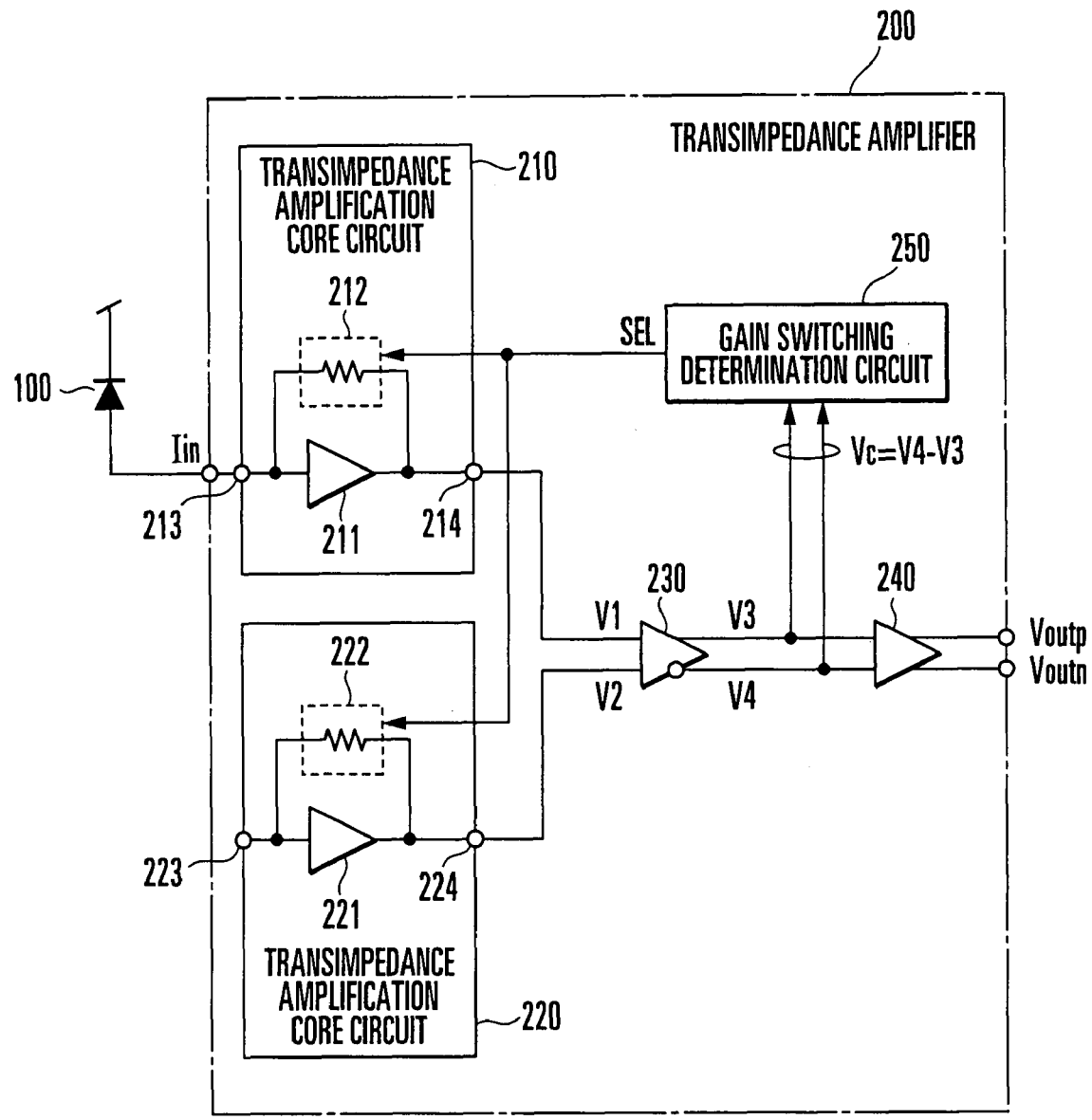
FIG. 1 is a block diagram showing the arrangement of a transimpedance amplifier according to the first embodiment of the present invention.

In an optical transmission circuit such as an optical transmission system, optical interconnection, or passive optical network (OPN) system which can perform high-speed data transmission, an optical reception circuit which converts an optical signal received by a light-receiving element 100 and sent through an optical fiber into an electrical signal uses a transimpedance amplifier 200 shown in FIG. 1.

As shown in FIG. 1, the transimpedance amplifier 200 mainly comprises a first transimpedance amplifier core circuit 210, second transimpedance amplifier core circuit 220, inter-stage buffer circuit 230, output buffer circuit 240, and gain switching determination circuit 250.

The first transimpedance amplifier core circuit 210 includes an amplification circuit 211, gain switching circuit 212, input terminal 213, and output terminal 214. The input terminal 213 connects to the output terminal of the light-receiving element 100. The amplification circuit 211 is a circuit which performs voltage conversion and signal amplification for an input current Iin input from the light-receiving element 100 to the input terminal 213 and outputs an output voltage V1 which changes in accordance with the input current Iin to the output terminal 214. The gain switching circuit 212 is a circuit which connects in parallel with the amplification circuit 211 between the input terminal 213 and the output terminal 214, and switches the transimpedance gains of the amplification circuit 211 in accordance with a gain switching signal SEL from the gain switching determination circuit 250.

Like the first transimpedance amplifier core circuit 210, the second transimpedance amplifier core circuit 220 includes an amplification circuit 221, gain switching circuit 222, input terminal 223, and output terminal 224. However, the input terminal 223 is open, and the amplification circuit 221 outputs, as a reference voltage for the output voltage V1, a constant output voltage V2 which does not change in accordance with the input current Iin from the output terminal 224. The gain switching circuit 222 is identical to the gain switching circuit 212 of the first transimpedance amplifier core circuit 210.

The inter-stage buffer circuit 230 is a buffer circuit which includes differential input terminals to which the output terminals 214 and 224 of the first and second transimpedance amplifier core circuits 210 and 220 connect, differentially amplifies (with, for example, gain=1) the output voltages V1 and V2 input to the differential input terminals, and outputs the amplified voltages as differential output signals based on an output voltage V3 (non-inverted output) and an output voltage V4 (inverted output) from differential output terminals.

The output buffer circuit 240 is a buffer circuit which includes differential input terminals to which the differential output terminals of the inter-stage buffer circuit 230 connect, differentially amplifies (with, for example, gain=1) the output voltages V3 and V4 input to the differential input terminals, and outputs output voltages Voutp (non-inverted output) and Voutn (inverted output) as output voltages Vout from the transimpedance amplifier 200.

The gain switching determination circuit 250 is a determination circuit which includes a gain switching comparator 251 shown in FIG. 3. The gain switching comparator 251 is a circuit which receives a comparative input voltage Vc (=V4−V3) based on the output voltages V3 and V4 from the inter-stage buffer circuit 230, and outputs a gain switching signal SEL to the gain switching circuits 212 and 222 of the first and second transimpedance amplifier core circuits 210 and 220 on the basis of the result obtained by comparing/determining the comparative input voltage with a first hysteresis characteristic. The gain switching signal SEL switches the gains of the first and second transimpedance amplifier core circuits 210 and 220.

In this embodiment, the gain switching determination circuit 250 outputs a gain switching signal on the basis of the result obtained by comparing/determining the comparative input voltage Vc as a differential output signal from the inter-stage buffer circuit 230, thereby performing gain switching operation of switching the gains of the first and second transimpedance amplifier core circuits 210 and 220.

The first and second transimpedance amplifier core circuits 210 and 220 used in the transimpedance amplifier 200 according to this embodiment will be further described with reference to FIGS. 3 and 4.

As shown in FIG. 3, the first transimpedance amplifier core circuit 210 comprises the amplification circuit 211, gain switching circuit 212, input terminal 213, and output terminal 214.

The amplification circuit 211 is an amplification circuit which includes a signal input terminal 211A connecting to the input terminal 213 and a signal output terminal 211B connecting to the output terminal 214, amplifies the input current Iin input to the signal input terminal 211A with the gain determined by the feedback resistance value of the gain switching circuit 212, and outputs the amplified current as a voltage signal from the signal output terminal .211B.

The gain switching circuit 212 is a circuit which connects in parallel with the amplification circuit 211 between the signal input terminal 211A and signal output terminal 211B of the amplification circuit 211, and switches feedback resistance values on the basis of the gain switching signal SEL from the gain switching determination circuit 250. Referring to FIG. 3, the gain switching circuit 212 comprises a parallel connection circuit of a resistive element RFa and a resistive element RFb (resistance value: RFa>RFb), and a switch SW1 which is turned on/off in accordance with the gain switching signal SEL connects in series with the resistive element RFb.

The switch SW1 comprises, for example, an NMOS transistor, which becomes nonconductive (OFF) when the gain switching signal SEL input to the gate terminal is set at LOW level. As a consequence, the overall feedback resistance value of the gain switching circuit 212 becomes the resistance value of the resistive element RFa. In contrast, this transistor becomes conductive (ON) when the gain switching signal SEL input to the gate terminal is set at HIGH level, and the resistive element RFa connecting in parallel with the resistive element FRb. As a consequence, the overall feedback resistance value of the gain switching circuit 212 becomes the parallel connection resistance value of the resistive element RFa and resistive element FRb. Therefore, since the feedback resistance value is large when the gain switching signal SEL is at LOW level, the gain of the first transimpedance amplifier core circuit 210 becomes high. Since the feedback resistance value is small when the gain switching signal SEL is at HIGH level, the gain of the first transimpedance amplifier core circuit 210 becomes low.

Figure 4:
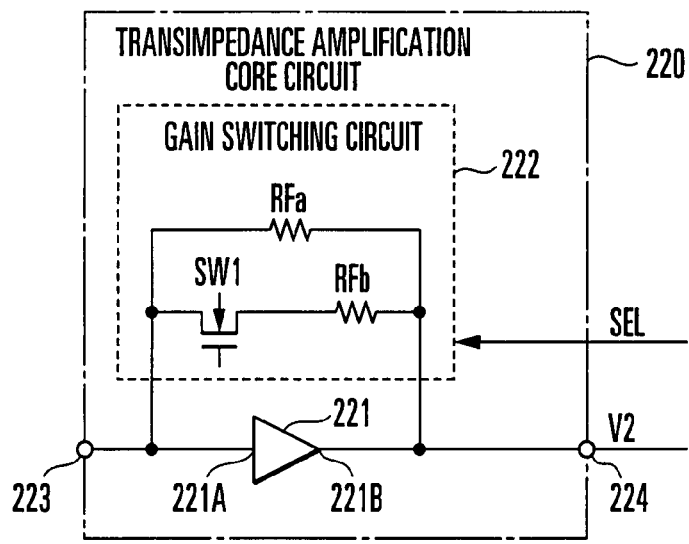
FIG. 4 is a circuit diagram showing the arrangement of a second transimpedance amplifier core circuit.

As shown in FIG. 4, the second transimpedance amplifier core circuit 220 comprises the amplification circuit 221, gain switching circuit 222, input terminal 223, and output terminal 224.

The amplification circuit 221 is an amplification circuit which includes a signal input terminal 221A connecting to the input terminal 223 and a signal output terminal 221B connecting to the output terminal 224, amplifies the input current Iin input to the signal input terminal 221A with the gain determined by the feedback resistance value of the gain switching circuit 222, and outputs the amplified current as a voltage signal from the signal output terminal 221B. In the case of the second transimpedance amplifier core circuit 220, since the input terminal 223 is open, the output voltage V2 (DC voltage) set when the input current Iin is zero (no input) is output from the signal output terminal 221B.

The gain switching circuit 222 is a circuit which connects in parallel with the amplification circuit 221 between the signal input terminal 221A and signal output terminal 221B of the amplification circuit 221, and switches feedback resistance values on the basis of the gain switching signal SEL from the gain switching determination circuit 250. Referring to FIG. 4, the gain switching circuit 222 comprises a parallel connection circuit of the resistive element RFa and the resistive element RFb, and the switch SW1 which is turned on/off in accordance with the gain switching signal SEL connects in series with the resistive element RFb. Note that the operation of the gain switching circuit 222 is the same as that of the gain switching circuit 212 described above, and a description thereof will be omitted.

The operation of the transimpedance amplifier 200 according to this embodiment will be described next with reference to FIGS. 5A to 5D, 6, 7A, 7B, and 8A to 8C.

Figure 5A:
FIG. 5A is a timing chart showing an example of the waveform of an input current.
Figure 5B:
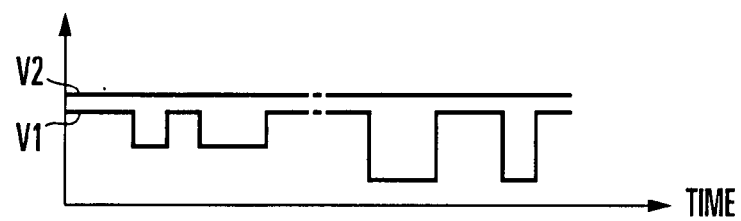
FIG. 5B is a timing chart showing examples of the waveforms of output voltages from first and second transimpedance amplifier core circuits.
Figure 5C:
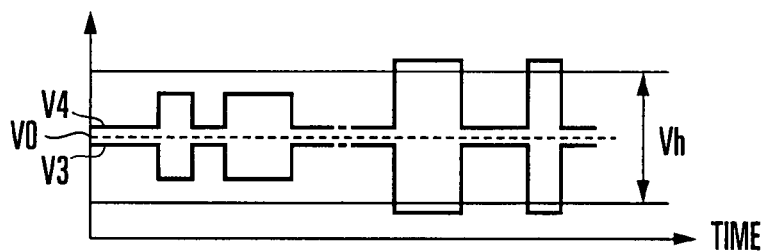
FIG. 5C is a timing chart showing examples of the waveforms of an inverted output voltage and non-inverted output voltage from an inter-stage buffer circuit.

The operation of the first transimpedance amplifier core circuit 210, second transimpedance amplifier core circuit 220, inter-stage buffer circuit 230, and output buffer circuit 240 will be described first with reference to FIGS. 5A to 5C.

The WDM (Wavelength Division Multiplex) circuit of an optical line terminal (OLT) demultiplexes an optical signal from an optical network unit (ONU) which reaches the optical line terminal through an optical fiber. The light-receiving element 100 of the optical reception circuit photoelectrically converts the resultant signal, and inputs the resultant current as the input current Iin to the transimpedance amplifier 200 (see FIG. 5A).

The first transimpedance amplifier core circuit 210 of the transimpedance amplifier 200 performs voltage conversion and signal amplification for the input input current Iin by using the amplification circuit 211, and outputs the output voltage V1 which changes in accordance with the input current Iin. On the other hand, the second transimpedance amplifier core circuit 220 always outputs, as a reference voltage for the output voltage V1, the constant output voltage V2 which does not change in accordance with the input current Iin (see FIG. 5B).

The inter-stage buffer circuit 230 receives the output voltage V1 from the first transimpedance amplifier core circuit 210 and the output voltage V2 from the second transimpedance amplifier core circuit 220, and obtains a differential output signal in which the potential difference (V4−V3) between the output voltages V3 and V4 increases as the input current Iin increases. The voltages V3 and V4 have signal waveforms with amplitudes vertically symmetrical with respect to a predetermined central potential V0 (see FIG. 5C).

The inter-stage buffer circuit 230 inputs the differential output signal to the output buffer circuit 240, which in turn outputs the signal as the output voltage Vout of the transimpedance amplifier 200 which comprises output voltages Voutp (non-inverted output) and Voutn (inverted output).

The operation of the gain switching determination circuit 250 will be described next with reference to FIGS. 5D, 6, 7A and 7B, and 8A to 8C.

Figure 5D:
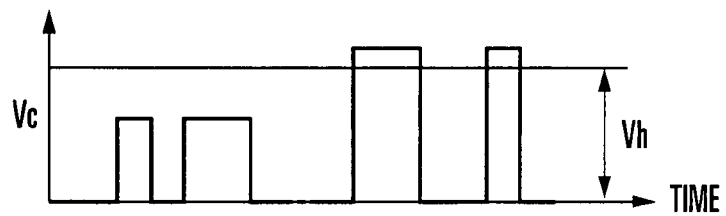
FIG. 5D is a timing chart showing an example of the waveform of a comparative input voltage to a gain switching comparator.

The inter-stage buffer circuit 230 supplies the differential output signal as the comparative input voltage Vc (=V4−V3) to the gain switching determination circuit 250 and inputs it to the gain switching comparator 251 of the gain switching determination circuit 250 (see FIG. 5D).

The gain switching comparator 251 has a hysteresis characteristic (first hysteresis characteristic). This hysteresis characteristic rises when the comparative input voltage Vc becomes higher than the first voltage level, and falls when the comparative input voltage Vc becomes lower than the second voltage level (<first voltage level). A reference voltage for the first and second voltage levels will be referred to as a reference voltage Vn.

Figure 6:
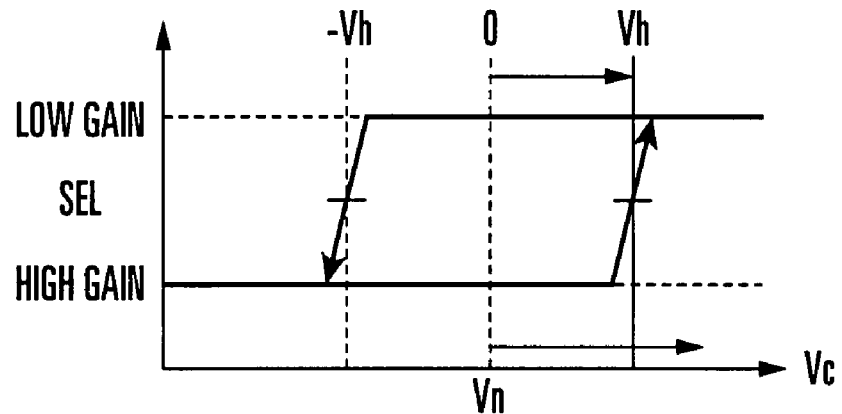
FIG. 6 is a graph showing an example of a hysteresis characteristic which the gain switching comparator has.

FIG. 6 shows an example of a hysteresis characteristic. This hysteresis characteristic is obtained by setting the comparative input voltage Vc (=0) as the reference voltage Vn when the input current Iin is zero. Therefore, the first voltage level at which the hysteresis characteristic rises is positive, and the second voltage level at which the hysteresis characteristic falls is negative. In this case, the first voltage level at which the hysteresis characteristic rises and the second voltage level at which the hysteresis characteristic falls will be referred to as a voltage detection level Vh and a voltage detection level −Vh, respectively.

According to the arrangement of the transimpedance amplifier 200 of this embodiment, since the input current Iin is always input from the light-receiving element 100, output voltage V2>output voltage V1, and comparative input voltage Vc (=V4−V3)>0. The gain switching comparator 251, which receives the comparative input voltage Vc as a differential input, compares the comparative input voltage Vc with the voltage detection level Vh. When, therefore, the comparative input voltage Vc exceeds the voltage detection level Vh, the hysteresis characteristic rises, and the logic level of the output from the gain switching comparator 251, i.e., the logic level of the gain switching signal SEL, is inverted.

When the output logic level is inverted once, the output logic level is not reset unless the comparative input voltage Vc changes to the voltage detection level −Vh at which the hysteresis characteristic falls. In this embodiment, since comparative input voltage Vc>0, the comparative input voltage Vc does not change to the voltage detection level −Vh. As a consequence, the output logic level which is inverted once is held.

As described above, the gain switching comparator 251 having the hysteresis characteristic shown in FIG. 6 uses only the hysteresis characteristic (rising operation region) with respect to the comparative input voltage Vc higher than the reference voltage Vn.

This embodiment initializes the logic level of the gain switching signal SEL to "high gain" before the reception of a packet, and switches the logic level of the gain switching signal SEL from "high gain" to "low gain" in accordance with the rising operation of the hysteresis characteristic of the gain switching comparator 251.

Note that for the initialization of the gain switching signal SEL, the gain switching comparator 251 may incorporate a switch (MOS transistor) which forcibly restores the comparative potential of the hysteresis comparator inside the gain switching comparator 251 in accordance with an external reset signal. This embodiment can obtain an external reset signal by detecting a reset signal sent together with a packet from the network side by using a known technique.

Figure 7A:
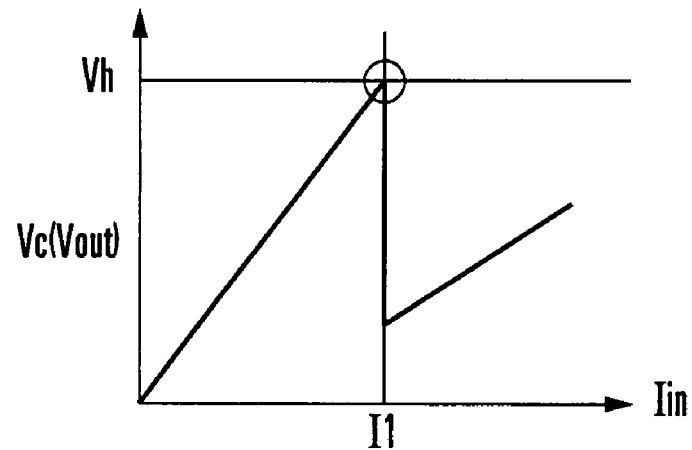
FIG. 7A is a graph which explains the operation characteristics of the gain switching comparator, and shows the relationship between an input current and a comparative input voltage.
Figure 7B:
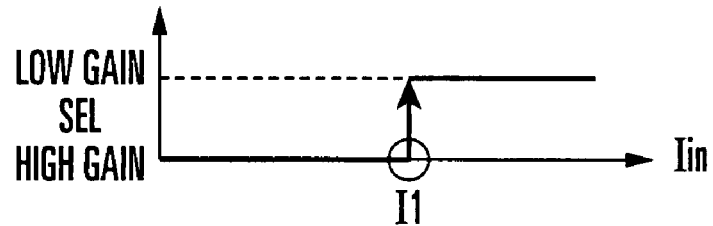
FIG. 7B is a graph which explains the operation characteristics of the gain switching comparator, and shows a change in the logic level of a gain switching signal.

As shown in FIG. 7A, if the comparative input voltage Vc reaches the voltage detection level Vh when the input current Iin reaches a current value I1, the gain switching comparator 251 rises, and the logic level of the gain switching signal SEL switches from "high gain" to "low gain", as shown in FIG. 7B. This reduces the gains of the first and second transimpedance amplifier core circuits 210 and 220. As a result, the output voltage Vout from the transimpedance amplifier and the comparative input voltage Vc decrease.

Figure 8A:
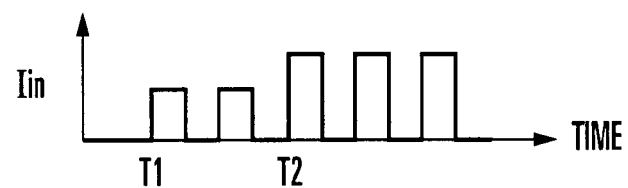
FIG. 8A is a timing chart showing an example of the operation of the transimpedance amplifier shown in FIG. 1, and changes in input current with time.
Figure 8B:
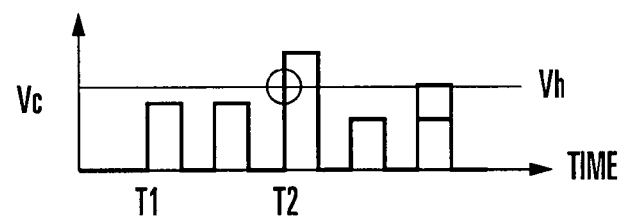
FIG. 8B is a timing chart showing an example of the operation of the transimpedance amplifier shown in FIG. 1, and changes in comparative input voltage with time.
Figure 8C:
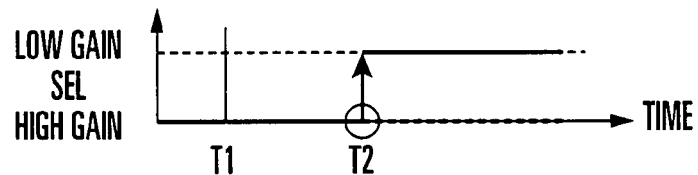
FIG. 8C is a timing chart showing an example of the operation of the transimpedance amplifier shown in FIG. 1, and a change in the logic level of a gain switching signal.

Assume that when the reception of a packet starts at time T1, the input current Iin increases, as shown in FIG. 8A, and the comparative input voltage Vc reaches the voltage detection level Vh at time T2, as shown in FIG. 8B. In this case, therefore, as shown in FIG. 8C, the gain switching signal SEL from the gain switching comparator 251 is inverted from "high gain" to "low gain". This reduces the gains of the first and second transimpedance amplifier core circuits 210 and 220.

Even if the comparative input voltage Vc becomes lower than the voltage detection level Vh afterward due to a reduction in gain, the gain switching comparator 251 does not fall unless Vc<−Vh due to the hysteresis characteristic of the gain switching comparator 251, and the gain switching signal SEL is not inverted from "high gain" to "low gain". This makes it possible to hold the gains of the first and second transimpedance amplifier core circuits 210 and 220 and output the stable output voltage Vout even if a reduction in gain occurs and also a reduction in the input current Iin occurs after the logic level of the gain switching signal SEL is switched from "high gain" to "low gain".

In this embodiment, the gain switching determination circuit 250 performs the gain switching operation of outputting the gain switching signal SEL on the basis of the result obtained by comparing/determining the comparative input voltage Vc as the differential output signal from the interstage buffer circuit 230 with the first hysteresis characteristic, and switching the gains of the first and second transimpedance amplifier core circuits 210 and 220. Therefore, using a hysteresis characteristic to determine on the basis of the comparative input voltage Vc whether it is necessary to switch gains makes it unnecessary to hold the comparative input voltage Vc for gain switching determination by using a level holding circuit with a slow response time. This makes it possible to instantaneously perform gain switching determination on the basis of the comparative input voltage Vc which changes in accordance with the input current Iin, thereby achieving instantaneous response corresponding to burst data.

The gain switching comparator 251 used in this embodiment has a hysteresis characteristic in which it performs rising operation within the range in which an input voltage, i.e., the comparative input voltage Vc, varies, and performs falling operation outside the range. However, the present invention is not limited to this, and the embodiment can also use a gain switching comparator which has a hysteresis characteristic in which it performs falling operation within the range in which an input voltage, i.e., the comparative input voltage Vc, varies, and performs rising operation outside the range. In this case, the embodiment may be configured to initialize the logic level of the gain switching signal SEL to "high gain" before the reception of a packet and switch the logic level of the gain switching signal SEL from "high gain" to "low gain" in accordance with the falling operation in the hysteresis characteristic of the gain switching comparator. The embodiment can therefore use a gain switching comparator having a hysteresis characteristic in which it performs rising operation or falling operation within the range in which an input voltage, i.e., the comparative input voltage Vc, varies, and performs rising operation or falling operation outside the range.

Second Embodiment

The arrangement of a transimpedance amplifier according to the second embodiment of the present invention will be described next with reference to FIGS. 9 to 11. The same reference numerals as in FIGS. 2 to 4 denote the same components in FIGS. 9 to 11.

The first embodiment has exemplified the case wherein the gains of the transimpedance amplifier core circuits 210 and 220 are switched by one step between "high gain" and "low gain". The second embodiment will exemplify a case wherein gains are switched by a plurality of steps, more specifically, a case wherein the gains of transimpedance amplifier core circuits 210 and 220 are switched by two steps between "high gain", "intermediate gain", and "low gain". Note that the constituent elements of the transimpedance amplifier according to this embodiment are the same as those in the first embodiment except for a gain switching determination circuit and first and second transimpedance amplifier core circuits, and a detailed description thereof will be omitted.

Figure 9:
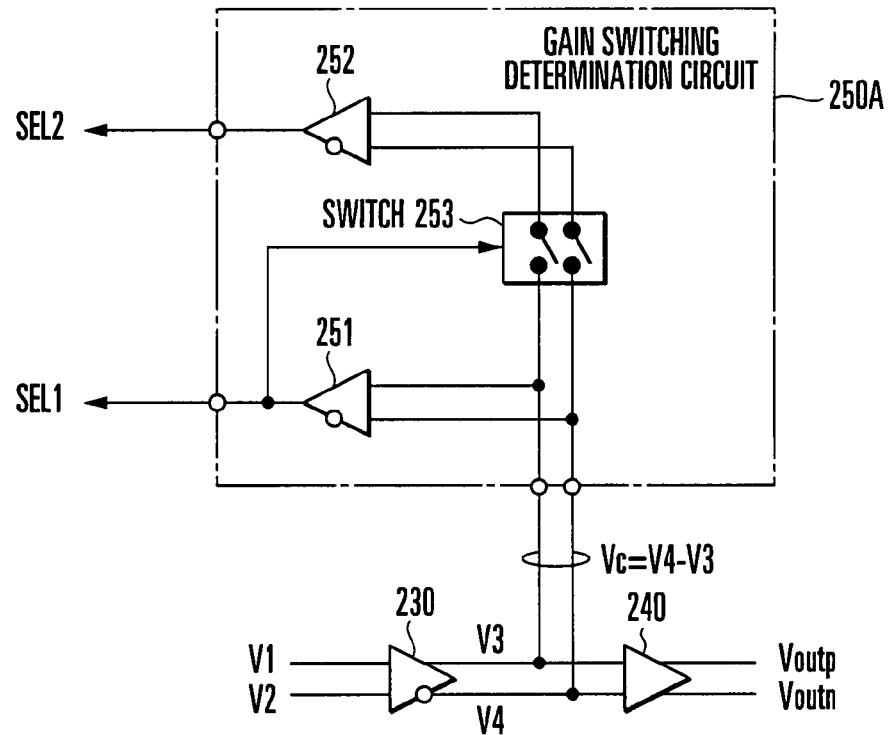
FIG. 9 is a circuit diagram showing the arrangement of a gain switching determination circuit used in a transimpedance amplifier according to the second embodiment of the present invention.

As shown in FIG. 9, as compared with the gain switching determination circuit 250 described in the first embodiment, a gain switching determination circuit 250A used in the second embodiment includes a gain switching comparator 252 and a switch 253 in addition to the gain switching comparator 251 described above. Note, however, that the gain switching comparator 251 is a hysteresis comparator which performs the gain switching operation of switching the gains of the transimpedance amplifier core circuits 210 and 220 from "high gain" to "intermediate gain" by outputting a first gain switching signal SEL1 in accordance with the result obtained by comparing/determining a comparative input voltage Vc with a hysteresis characteristic.

The switch 253 is a switch circuit provided between the differential output terminals of the inter-stage buffer circuit 230 and the differential input terminals of the gain switching comparator 252. The output terminal of the gain switching comparator 251 connects to the switching control input terminal of the switch 253. The switch 253 operates from "OFF" to "ON" when the logic level of the first gain switching signal SEL1 output from the gain switching comparator 251 is inverted from "high gain" to "intermediate gain", and supplies the comparative input voltage Vc to the gain switching comparator 252.

The gain switching comparator 252 is identical to the gain switching comparator 251. More specifically, the gain switching comparator 252 is a hysteresis comparator which has differential input terminals connecting to the differential output terminals of an inter-stage buffer circuit 230 through the switch 253, compares/determines the comparative input voltage Vc input to the differential input terminals with a hysteresis characteristic, and outputs a second gain switching signal SEL2 from the output terminal in accordance with the comparison/determination result. The second gain switching signal SEL2 switches the gains of the first and second transimpedance amplifier core circuits 210 and 220 from "intermediate gain" to "low gain".

Figure 10:
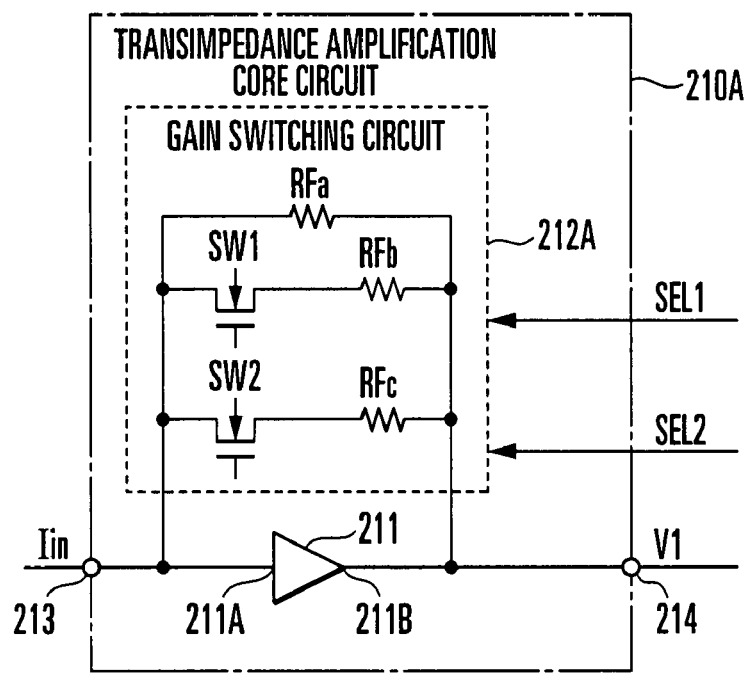
FIG. 10 is a circuit diagram showing an example of the arrangement of a first transimpedance amplifier core circuit used in the transimpedance amplifier according to the second embodiment of the present invention.

As shown in FIG. 10, as compared with the first transimpedance amplifier core circuit 210 described in the first embodiment, a first transimpedance amplifier core circuit 210A used in the second embodiment includes a gain switching circuit 212A in place of the gain switching circuit 212.

The gain switching circuit 212A is obtained by adding a series connection circuit of a resistive element RFc (resistance value: RFa>RFb>RFc) and a switch SW2 in parallel with the resistive element RFa of the gain switching circuit 212. A switch SW1 operates in accordance with the logic level of the first gain switching signal SEL1, and a switch SW2 operates in accordance with the logic level of the second gain switching signal SEL2. While the switches SW1 and SW2 are off, the feedback resistance value becomes maximum, and "high gain" is set. Sequentially turning on the switches SW1 and SW2 will decrease the feedback resistance value stepwise and make the gain shift as follows: "high gain"→"intermediate gain"→"low gain".

Figure 11:
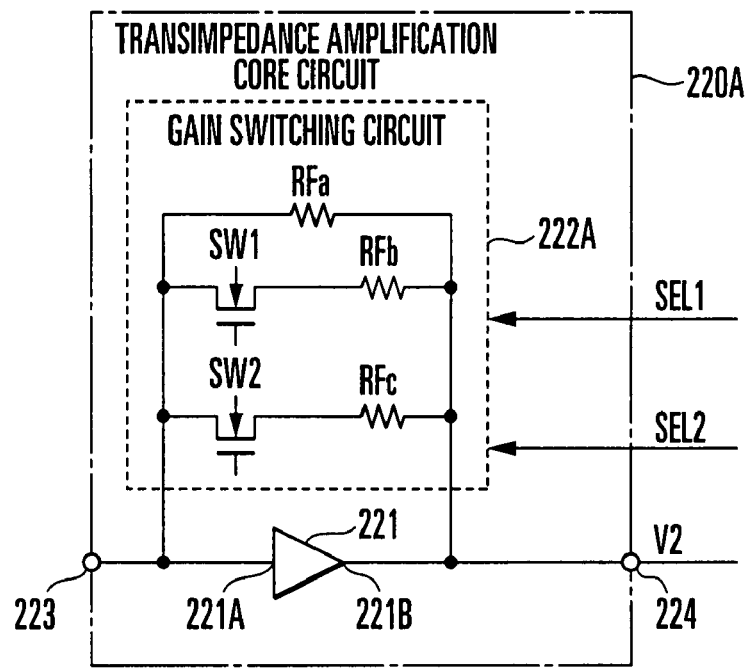
FIG. 11 is a circuit diagram showing an example of the arrangement of a second transimpedance amplifier core circuit used in the transimpedance amplifier according to the second embodiment of the present invention.
Figure 12A:
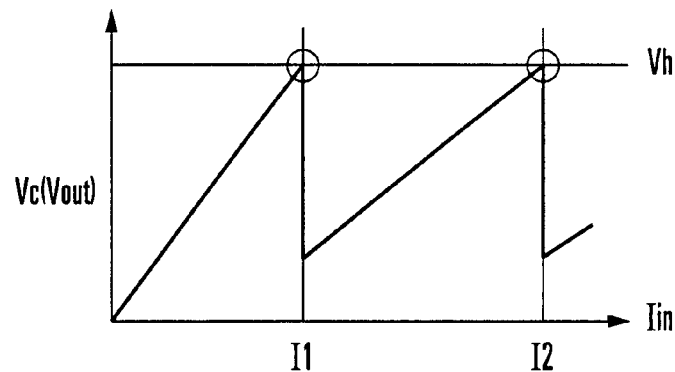
FIG. 12A is a graph which explains the operation characteristics of a gain switching comparator, and shows the relationship between an input current and a comparative input voltage.
Figure 12B:
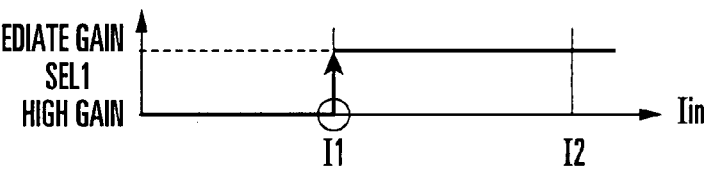
FIG. 12B is a graph which explains the operation characteristics of the gain switching comparator, and shows a change in the logic level of a first gain switching signal.
Figure 12C:
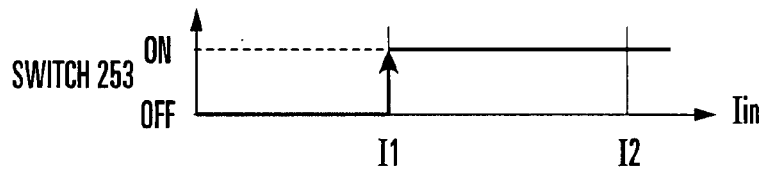
FIG. 12C is a graph which explains the operation characteristics of the gain switching comparator, and shows a change in the state of a switch 253.
Figure 12D:
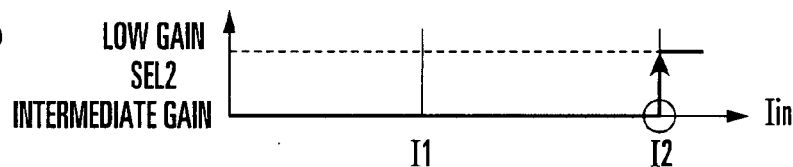
FIG. 12D is a graph which explains the operation characteristics of the gain switching comparator, and shows a change in the logic level of a second gain switching signal.
Figure 12E:
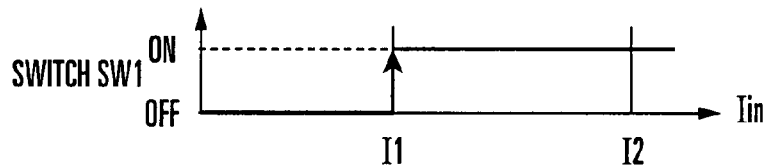
FIG. 12E is a graph which explains the operation characteristics of the gain switching comparator, and shows a change in the state of a switch SW1.
Figure 12F:
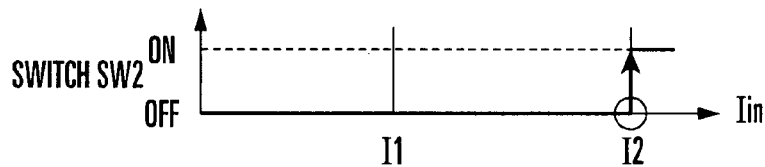
FIG. 12F is a graph which explains the operation characteristics of the gain switching comparator, and shows a change in the state of a switch SW2.
Figure 12G:
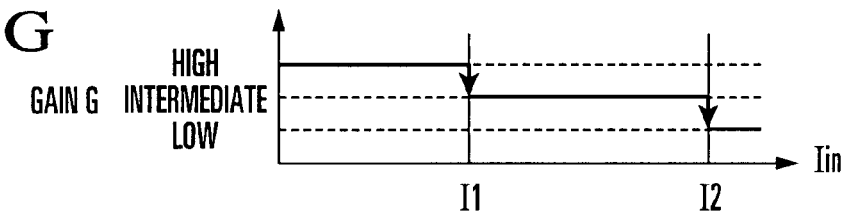
FIG. 12G is a graph which explains the operation characteristics of the gain switching comparator, and shows changes in the gains of first and second transimpedance amplifier core circuits.
Figure 13A:
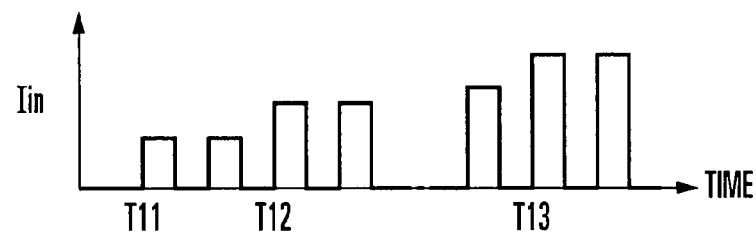
FIG. 13A is a timing chart showing an example of the operation the transimpedance amplifier according to the second embodiment of the present invention, showing changes in input current with time.
Figure 13B:
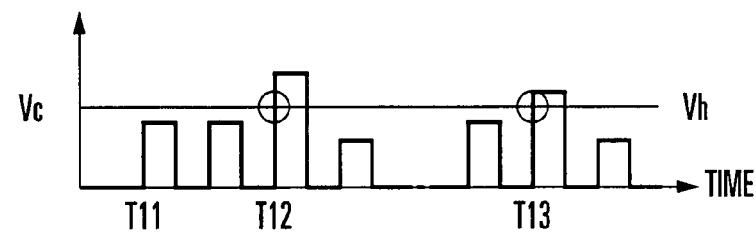
FIG. 13B is a timing chart showing an example of the operation of the transimpedance amplifier according to the second embodiment of the present invention, showing changes in comparative input voltage with time.
Figure 13C:
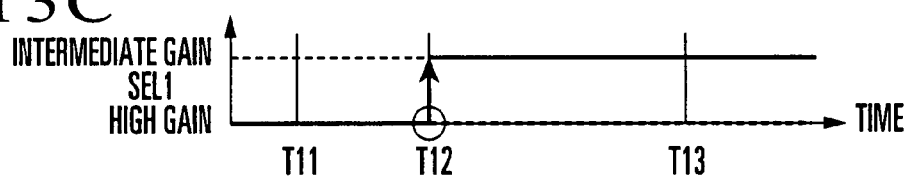
FIG. 13C is a timing chart showing an example of the operation of the transimpedance amplifier according to the second embodiment of the present invention, showing a change in the logic level of a first gain switching signal with time.
Figure 13D:
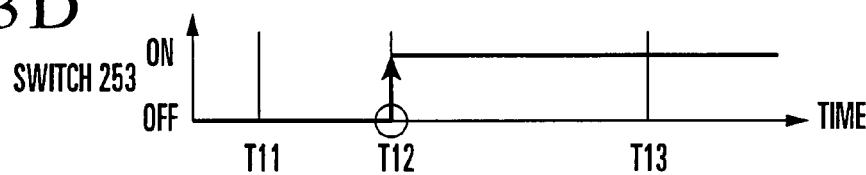
FIG. 13D is a timing chart showing an example of the operation of the transimpedance amplifier according to the second embodiment of the present invention, showing a change in the state of a switch 253 with time.
Figure 13E:
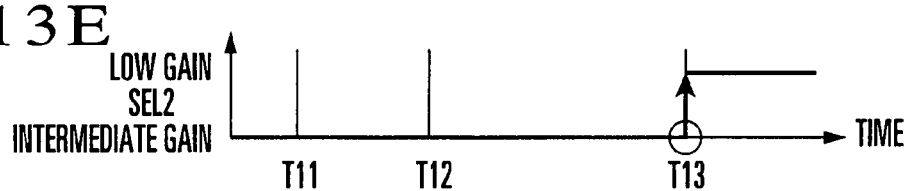
FIG. 13E is a timing chart showing an example of the operation of the transimpedance amplifier according to the second embodiment of the present invention, showing a change in the logic level of a second gain switching signal.
Figure 13F:
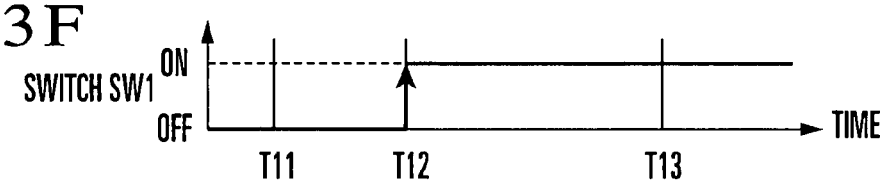
FIG. 13F is a timing chart showing an example of the operation of the transimpedance amplifier according to the second embodiment of the present invention, showing a change in the state of a switch SW1 with time.
Figure 13G:
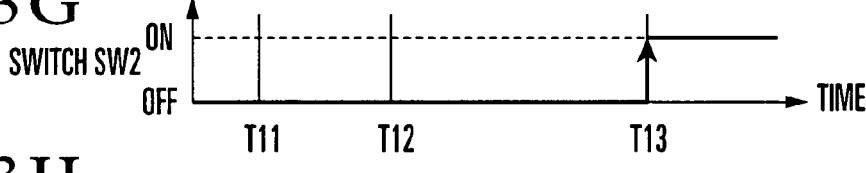
FIG. 13G is a timing chart showing an example of the operation of the transimpedance amplifier according to the second embodiment of the present invention, showing a change in the state of a switch SW2 with time.
Figure 13H:
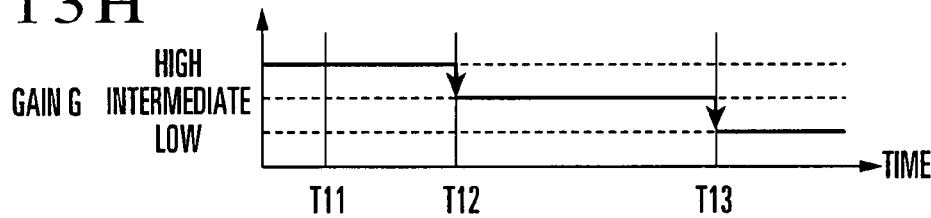
FIG. 13H is a timing chart showing an example of the operation of the transimpedance amplifier according to the second embodiment of the present invention, showing changes in the gains of first and second transimpedance amplifier core circuits with time.

As shown in FIG. 11, as compared with the second transimpedance amplifier core circuit 220 described in the first embodiment, a second transimpedance amplifier core circuit 220A used in the second embodiment includes a gain switching circuit 222A in place of the gain switching circuit 222. The gain switching circuit 222A has the same arrangement as that of the gain switching circuit 212A. Sequentially turning on switches SW1 and SW2 will decrease the feedback resistance value stepwise and make the gain shift as follows: "high gain"→"intermediate gain"→"low gain".

The operation of the transimpedance amplifier according to this embodiment will be described next with reference to FIGS. 12A to 12G and 13A to 13H.

As shown in FIGS. 12A to 12G, in the interval in which an input current Iin increases and reaches the current value I1, i.e., the initial state, since the comparative input voltage Vc is lower than a voltage detection level Vh, the first gain switching signal SEL1 indicates the logic level corresponding to "high gain". In accordance with this, the switch 253 is controlled in the OFF state, and hence does not supply the comparative input voltage Vc to the gain switching comparator 252. The second gain switching signal SEL2 therefore indicates the logic level corresponding to "intermediate gain". As a consequence, the switches SW1 and SW2 of the gain switching circuits 212A and 222A are turned off to select "high gain".

When the input current Iin increases and reaches the current value I1, the comparative input voltage Vc reaches the voltage detection level Vh. As a consequence, the gain switching comparator 251 rises to switch the logic level of the first gain switching signal SEL1 from "high gain" to "intermediate gain". This controls the switches SW1 of the gain switching circuits 212A and 222A in the ON state to decrease the feedback resistance value and select "intermediate gain".

When the logic level of the first gain switching signal SEL1 switches from "high gain" to "intermediate gain", the switch 253 is turned on to supply the comparative input voltage Vc to the gain switching comparator 252. In this case, since the gains of the first and second transimpedance amplifier core circuits 210A and 220A are controlled to "intermediate gain" as described above, an output voltage Vout from the transimpedance amplifier and the comparative input voltage Vc decrease in consequence. For this reason, in the gain switching comparator 252, the comparative input voltage Vc does not reach the voltage detection level Vh, and the logic level of the second gain switching signal SEL2 remains "intermediate gain".

Subsequently, the input current Iin further increases and reaches the current value I2, the comparative input voltage Vc reaches the voltage detection level Vh again. As a consequence, the gain switching comparator 252 rises to switch the logic level of the second gain switching signal SEL2 from "intermediate gain" to "low gain". This controls the switches SW2 of the gain switching circuits 212A and 222A in the ON state. The feedback resistance value then further decreases to select "low gain".

As shown in FIGS. 13A to 13H, therefore, in the interval between the instant at which the reception of a packet starts at time T11 and the instant at which the comparative input voltage Vc reaches the voltage detection level Vh, the first gain switching signal SEL1 from the gain switching comparator 251 indicates "high gain", and the second gain switching signal SEL2 indicates "intermediate gain". As a consequence, the switches SW1 and SW2 are turned off, and the gains of the first and second transimpedance amplifier core circuits 210A and 220A become "high gain".

Subsequently, when the input current Iin increases and the comparative input voltage Vc reaches the voltage detection level Vh at time T12, the first gain switching signal SEL1 from the gain switching comparator 251 is inverted from "high gain" to "intermediate gain". As a consequence, the switch SW1 is turned on, and the gains of the first and second transimpedance amplifier core circuits 210A and 220A become "intermediate gain", thereby decreasing the comparative input voltage Vc.

When the input current Iin increases and the comparative input voltage Vc reaches the voltage detection level Vh at time T13, the second gain switching signal SEL2 from the gain switching comparator 252 is inverted from "intermediate gain" to "low gain". As a consequence, the switch SW2 is turned on, and the gains of the first and second transimpedance amplifier core circuits 210A and 220A become "low gain".

As described above, in addition to the gain switching comparator 251 constituting the gain switching determination circuit 250 in the first embodiment, this embodiment includes the identical gain switching comparator 252, causes the switch 253 to operate from "OFF" to "ON" when the logic level of the first gain switching signal SEL1 output from the gain switching comparator 251 is inverted, and supplies the comparative input voltage Vc to the differential input terminals of the gain switching comparator 252. This makes it possible to obtain the same function and effect as those of the first embodiment and switch the gains of the first and second transimpedance amplifier core circuits 210A and 220A in a plurality of steps.

Once the output logic levels of the gain switching comparators 251 and 252 are inverted, the output logic levels are not reset unless the comparative input voltage Vc changes to the voltage detection level −Vh at which the hysteresis characteristic falls. In this embodiment, since comparative input voltage Vc>0, the comparative input voltage Vc does not change to the voltage detection level −Vh. As a result, the output logic levels which are inverted once are held. This embodiment can therefore implement both the gain switching determination function and the state holding function even when performing gain switching in a plurality of steps.

Although this embodiment has exemplified the case wherein two-step switching is performed between "high gain", "intermediate gain", and "low gain", the present invention is not limited to this. When switching is to be performed in three or more steps, it suffices to connect a necessary number of gain switching comparators in series through switches and ON/OFF-control each switch in accordance with a gain switching signal output from the preceding gain switching comparator.

In addition, this embodiment has exemplified the case wherein each gain switching comparator uses the same hysteresis characteristic, i.e., the same voltage detection level, the present invention is not limited to this. The respective comparators may use different hysteresis characteristics, i.e., different voltage detection levels.

Third Embodiment

A concrete example of a transimpedance amplifier core circuit used in a transimpedance amplifier according to the third embodiment of the present invention will be described next with reference to FIGS. 14 to 16.

Figure 14:
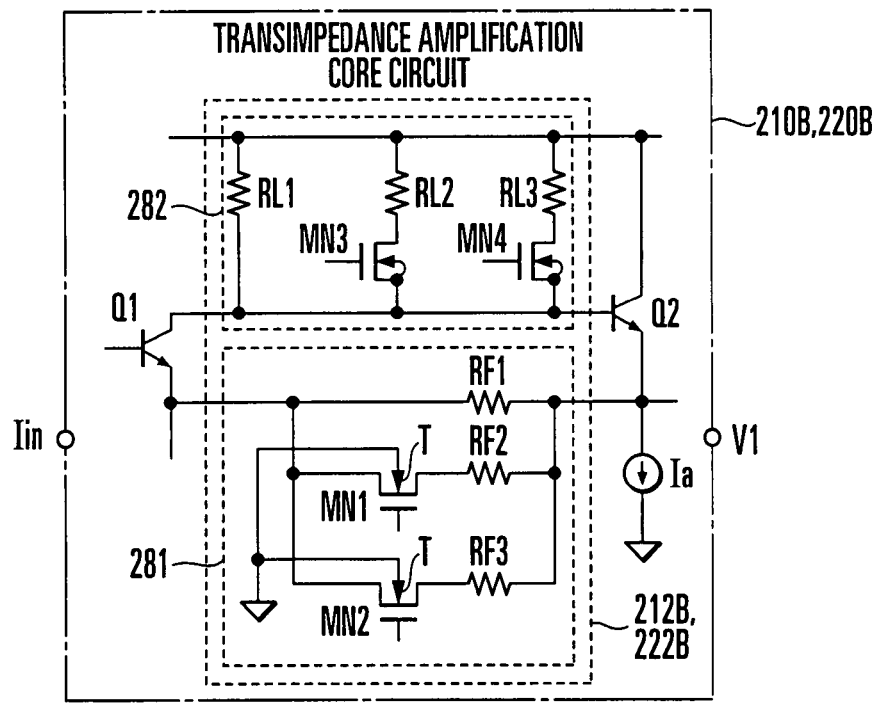
FIG. 14 is a circuit diagram showing an example of the arrangement of the main part of a transimpedance amplifier core circuit used in a transimpedance amplifier according to the third embodiment of the present invention.

Each of transimpedance amplifier core circuits 210B and 220B in FIG. 14 includes a transimpedance gain switching circuit 281 which switches transimpedance gains and an open loop gain switching circuit 282 which switches open loop gains as each of gain switching circuits 212B and 222B which switches the gains in two steps between "high gain", "intermediate gain", and "low gain".

The transimpedance gain switching circuit 281 comprises feedback resistors RF1, RF2, and RF3 which determine a transimpedance gain and NMOS transistors NM1 and MN2 which operate as switches. The open loop gain switching circuit 282 comprises load resistors RL1, RL2, and RL3 which determine an open loop gain and NMOS transistors MN3 and MN4 which operate as switches. The NMOS transistors MN1 to MN4 connect and disconnect the feedback resistors RF2 and RF3 and the load resistors RL2 and RL3 to switch to a desired feedback resistance value and a desired load resistance value. Note that PMOS transistors can also implement switches which switch feedback resistance values and load resistance values if the logic level of each gain switching signal is inverted.

Figure 15:
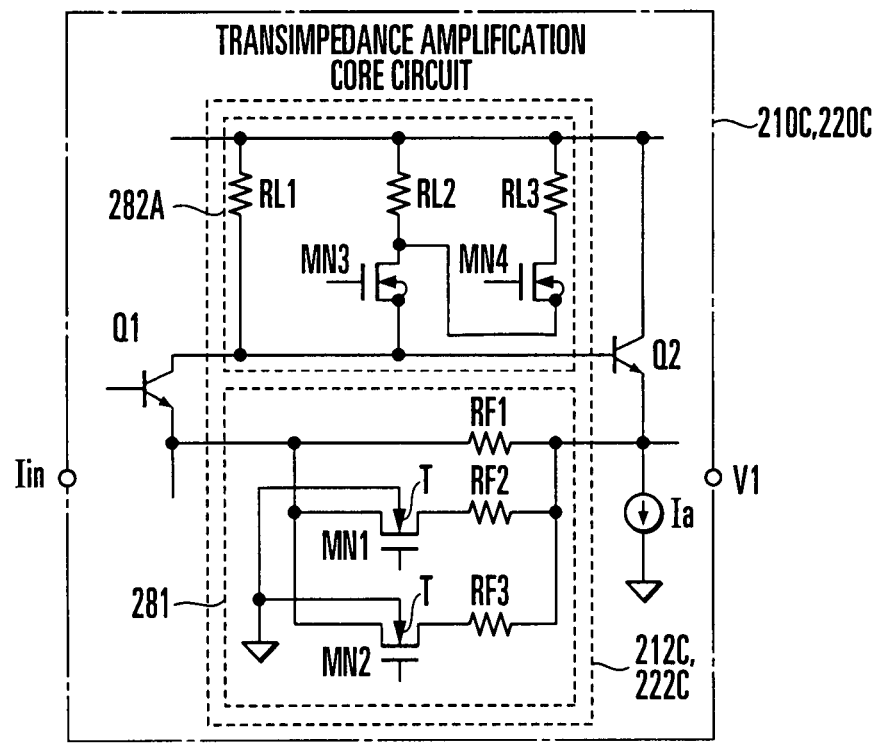
FIG. 15 is a circuit diagram showing another example of the arrangement of the main part of the transimpedance amplifier core circuit used in a transimpedance amplifier according to the third embodiment of the present invention.

Transimpedance amplifier core circuits 210 and 220 in FIG. 15 are obtained by replacing the open loop gain switching circuit 282 in FIG. 14 with an open loop gain switching circuit 282A. In the open loop gain switching circuit 282A, the source of the NMOS transistor NM4 connects to the drain of the NMOS transistor MN3 instead of its source. This makes it possible to reduce the influence of the parasitic capacitance of the NMOS transistor NM4 at the time of application of the maximum load resistance.

Figures 16, 17:
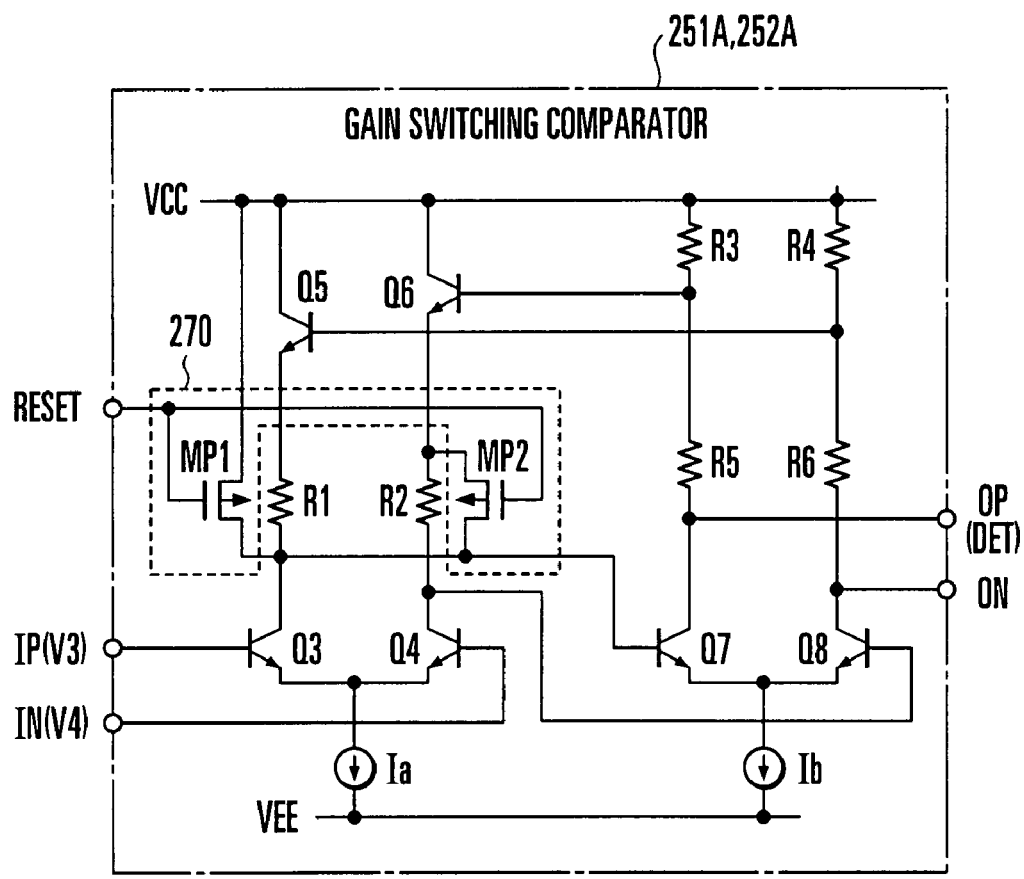
FIG. 16 is a view for explaining gain switching control on a transimpedance amplifier core circuit.
FIG. 17 is a circuit diagram showing an example of the arrangement of a gain switching comparator used in the gain switching determination circuit of a transimpedance amplifier according to the fourth embodiment of the present invention.

FIG. 16 shows the relationship between the gain switching signals and the gate potentials (H=HIGH level and L=LOW level) of the NMOS transistors MN1 to MN4. In this case, the gate terminals of the NMOS transistors MN1 and MN3 of the transimpedance gain switching circuit 281 receive a first gain switching signal SEL1 generated by a gain switching determination circuit 250A shown in FIG. 9, and the gate terminals of the NMOS transistors MN2 and MN4 of the open loop gain switching circuits 282 and 282A receive a second gain switching signal SEL2. With this operation, the load resistors RL2 and RL3 connect and disconnect upon switching of feedback resistance values as the feedback resistors RF2 and RF3 connect and disconnect, thereby switching load resistance values. This makes it possible to switch the gains between "high gain", "intermediate gain", and "low gain" and automatically select an open loop gain suitable for a selected transimpedance gain.

Referring to FIGS. 14 and 15, substrate terminals T of the NMOS transistors MN1 and MN2 used as switches which switch feedback resistance values connect to ground potential (GND) instead of the source, thus setting the substrate potential to a potential lower than the source potential. This makes it possible to improve the band of the transimpedance amplifier by extending the depletion layer and reducing the parasitic capacitance between the drain and source of each NMOS transistor, thereby allowing high-speed operation.

Fourth Embodiment

A concrete example of a gain switching determination circuit used in a transimpedance amplifier according to the fourth embodiment of the present invention will be described next with reference to FIG. 17. The reset function of hysteresis comparators used as gain switching comparators 251 and 252 in gain switching determination circuits 250 and 250A will be described in detail in this embodiment.

As described in the above embodiment, since the gain switching comparators 251 and 252 of the gain switching determination circuits 250 and 250A each use only the rising operation of a hysteresis characteristic, it is necessary to initialize the operation state of each hysteresis comparator when receiving a next packet. As shown in FIG. 17, in this embodiment, each of gain switching comparators 251A and 252A includes a reset circuit 270 which initializes the operation state on the basis of an externally input reset signal (external control signal) RESET.

In each of the gain switching comparators 251A and 252A, reference symbols R1 to R6 denote resistors, Q3 to Q8, NPN transistors; MP1 and MP2, PMOS transistors; and Ia and Ib, current sources. Of these components, the PMOS transistors MP1 and MP2 constitute the reset circuit 270. The gate terminal of the PMOS transistor MP1 connects to the reset terminal to which the reset signal RESET is input. This transistor applies a power supply potential VCC to the collector terminal of the NPN transistor Q3 constituting a comparison circuit. The gate terminal of the PMOS transistor MP2 connects to the reset terminal. This transistor short-circuits the current supply resistor R4 to the NPN transistor Q4 constituting a comparison circuit. The externally supplied reset signal RESET turns on the PMOS transistors MP1 and MP2 to forcibly restore the collector potentials of the transistors Q3 and Q4 to the initial values. This initializes the operation states of the gain switching comparators 251A and 252A.

Note that NMOS transistors can replace the PMOS transistors MP1 and MP2 if the logic level of the reset signal RESET is inverted.

In a hysteresis comparator used as a gain switching comparator, when a voltage V4 at an inverting input terminal IN exceeds a predetermined potential difference with respect to a voltage V3 at a non-inverting input terminal IP, a non-inverting output terminal OP outputs a high voltage to an inverting output terminal ON. In contrast, the voltage V3 at the non-inverting input terminal IP exceeds a given potential difference with respect to the voltage V4 at the inverting input terminal IN, the inverting output terminal ON outputs a high voltage to the non-inverting output terminal OP.

As described in the first embodiment, since a differential output signal from the inter-stage buffer circuit 230 is not inverted (Vc>0), there is no chance that the voltage at the inverting output terminal ON will be automatically restored to a high voltage (initial state) with respect to the voltage at the non-inverting output terminal OP upon inversion of the differential output signal.

This embodiment additionally includes the reset circuit (PMOS transistors MP1 and MP2) 270 which receives the reset signal RESET at the reset terminal to apply an internal voltage to forcibly set the voltage at the inverting output terminal ON higher than that at the non-inverting output terminal OP. This makes it possible to restore the voltages at the two output terminals OP and ON to the initial values.

In a PON system, since packets differ in signal amplitude, it is necessary to frequently switch the gains of transimpedance amplifier core circuits 210 and 220 in accordance with the amplitude of each packet. For this reason, the gain switching comparators 251 and 252 of the gain switching determination circuits 250 and 250A need to perform initialization for each packet. However, since the comparative input voltage Vc input to the hysteresis comparator of each of the gain switching comparators 251 and 252 is not inverted, the comparator cannot perform initialization. In contrast, the reset circuit 270 in this embodiment can forcibly restore the hysteresis comparator to the initial state and perform initialization by using the external reset signal RESET. Note that the reset signal RESET can be obtained by detecting a reset signal sent for each packet from the network side by using a known technique.

Fifth Embodiment

The arrangement of a transimpedance amplifier according to the fifth embodiment of the present invention will be described next with reference to FIG. 18. This embodiment causes a second transimpedance amplifier core circuit to output an output voltage V2 whose high-frequency components are attenuated. Note that the same reference numerals as in FIG. 1 denote the same parts in FIG. 18.

Figure 18:
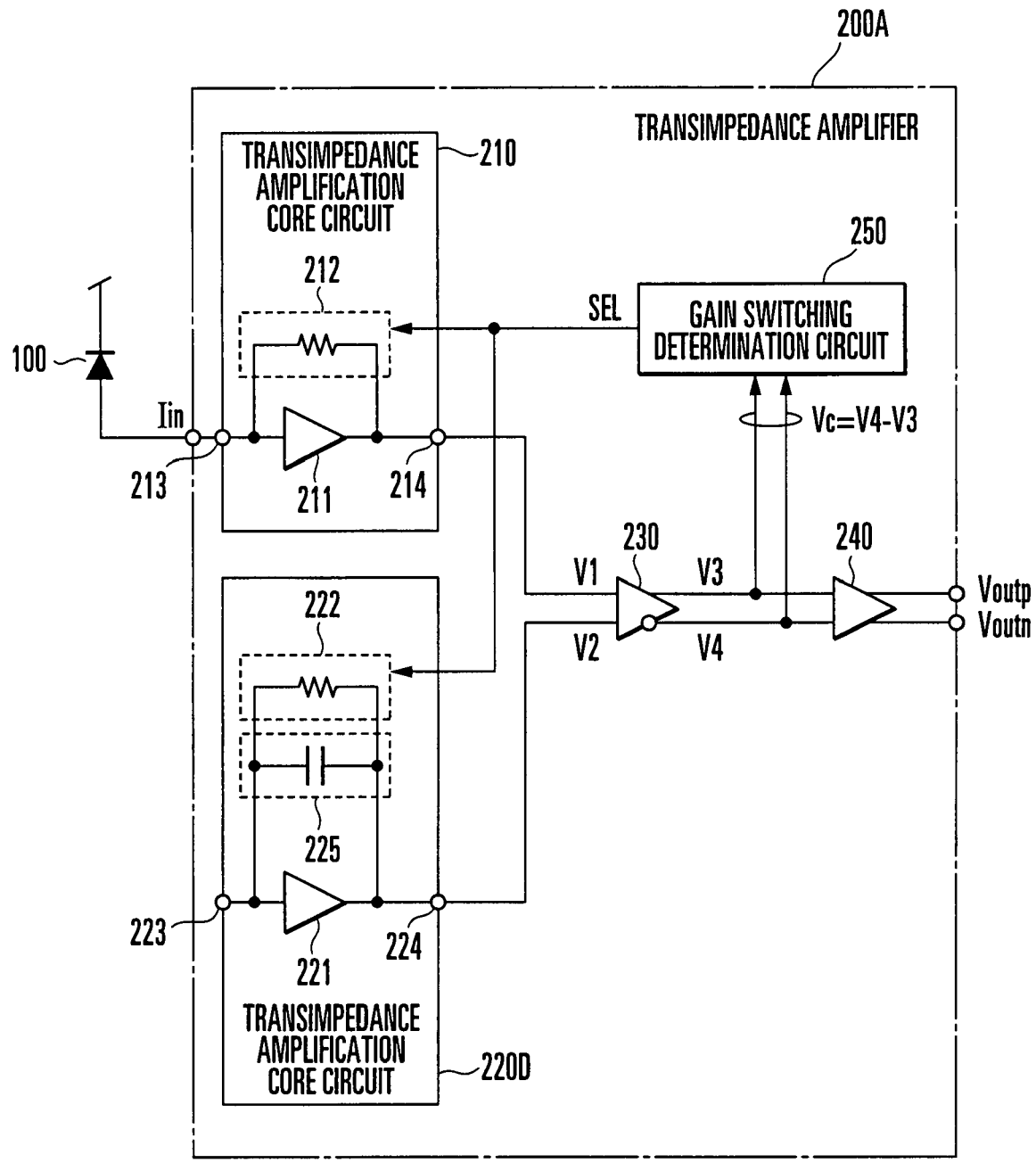
FIG. 18 is a block diagram showing the arrangement of a transimpedance amplifier according to the fifth embodiment of the present invention.

As shown in FIG. 18, as compared with the transimpedance amplifier 200 according to the first embodiment, a transimpedance amplifier 200A according to the fifth embodiment includes a second transimpedance amplifier core circuit 220D in place of the second transimpedance amplifier core circuit 220.

In addition to the amplification circuit 221, gain switching circuit 222, input terminal 223, and output terminal 224, which have been described above, the second transimpedance amplifier core circuit 220D includes a filter circuit 225 which attenuates the high-frequency components of the output voltage V2 output from the amplification circuit 221.

Figure 19:
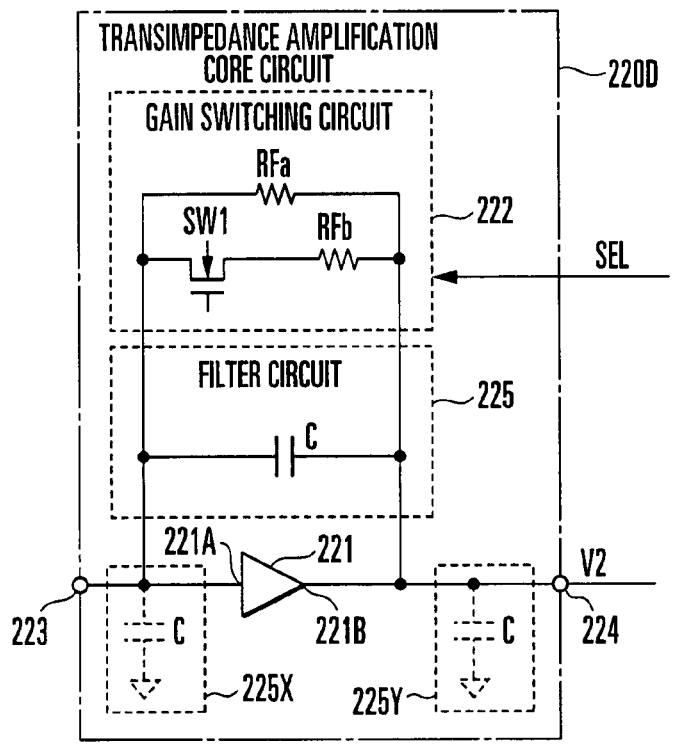
FIG. 19 is a circuit diagram showing the arrangement of a second transimpedance amplifier core circuit.

FIG. 19 shows the filter circuit 225 which comprises a capacitive element C connecting between a signal input terminal 221A and signal output terminal 221B of the amplification circuit 221. The filter circuit 225 constitutes an amplification circuit with a low-pass filter function, together with the amplification circuit 221 and the gain switching circuit 222.

The placement position of the filter circuit 225 is not limited to that between the signal input terminal 221A and signal output terminal 221B of the amplification circuit 221. At least one of the two connection terminals of the capacitive element C may connect to the amplification circuit 221.

For example, a filter circuit 225X comprises the capacitive element C connecting between the signal input terminal 221A of the amplification circuit 221 and ground potential. The capacitive element C of the filter circuit 225X attenuates the high-frequency components of an input signal input to the amplification circuit 221. As a result, the second transimpedance amplifier core circuit 220 outputs the low-noise output voltage V2.

A filter circuit 225Y is an example comprising the capacitive element C connecting between the signal output terminal 221B of the amplification circuit 221 and ground potential. The capacitive element C of the filter circuit 225Y attenuates the high-frequency components of the output voltage V2 output from the amplification circuit 221. As a result, the second transimpedance amplifier core circuit 220 outputs the low-noise output voltage V2.

Note that in each of the filter circuits 225X and 225Y, ground potential connecting to one end of the capacitive element C may be an arbitrary power supply potential as long as it has a low impedance.

In this embodiment, since the second transimpedance amplifier core circuit 220D includes the filter circuit 225 to output the output voltage V2 with attenuated high-frequency components, the signal band of the output voltage V2 as a reference voltage can be reduced, and sufficient low-noise characteristics can be obtained.

For example, as in the first embodiment, the transimpedance amplifier 200, which includes the two transimpedance amplifier core circuits, i.e., the first transimpedance amplifier core circuit 210 used as a main core which amplifies the input current Iin from the light-receiving element 100 and the second transimpedance amplifier core circuit 220 used as a dummy core which generates a reference potential, uses the same circuit arrangement for the main core and dummy core for noise reduction.

This arrangement can obtain highly instantaneous response characteristics. However, since both the dummy core and the main core have the same wide frequency characteristics, high-frequency components tend to appear in a reference voltage requiring only DC components due to noise, resulting in a deterioration in noise characteristics.

In this embodiment, the second transimpedance amplifier core circuit 220D corresponding to this dummy core includes the filter circuit 225 to reduce the high-frequency band of the frequency characteristics of the second transimpedance amplifier core circuit 220D. This makes it possible to reduce the noise band of a reference voltage, i.e., the output voltage V2, and obtain sufficiently low noise characteristics.

Even if, therefore, importance is placed on instantaneous response characteristics, this embodiment can suppress noise and obtain operation stability, thereby implementing the transimpedance amplifier 200A having both instantaneous response characteristics and operation stability.

Sixth Embodiment

The arrangement of a transimpedance amplifier according to the sixth embodiment of the present invention will be described next with reference to FIG. 20. Note that the same reference numerals as in FIG. 11 denote the same or equivalent parts in FIG. 11.

The fifth embodiment has exemplified the case wherein each of the transimpedance amplifier core circuits 210 and 220D performs gain switching in one step between "high gain" and "low gain". The sixth embodiment will exemplify a case wherein gain switching is performed in a plurality of steps, more specifically, each transimpedance amplifier core circuit performs gain switching in two steps between "high gain", "intermediate gain", and "low gain". Note that the constituent elements of a transimpedance amplifier according to this embodiment are the same as those of the second embodiment except for the second transimpedance amplifier core circuit, and a detailed description thereof will be omitted.

Figure 20:
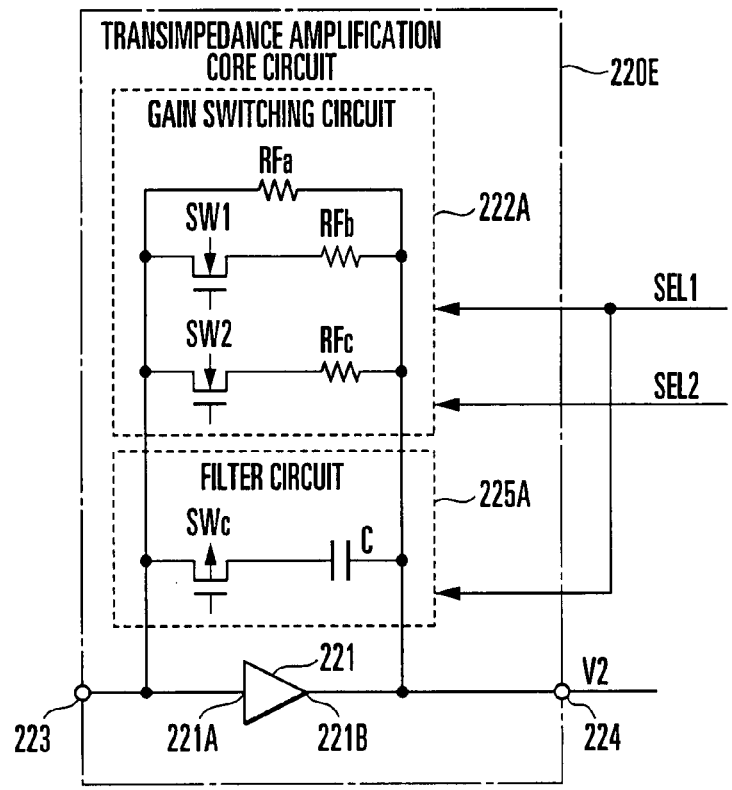
FIG. 20 is a circuit diagram showing an example of the arrangement of a second transimpedance amplifier core circuit used in a transimpedance amplifier according to the sixth embodiment of the present invention.
Figure 21A:
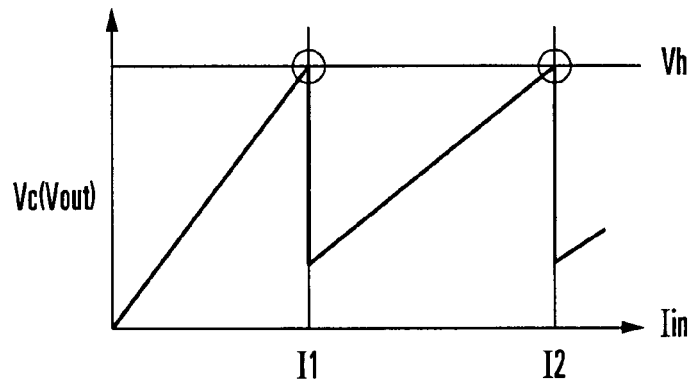
FIG. 21A is a graph which explains the operation characteristics of a gain switching comparator, and shows the relationship between an input current and a comparative input voltage.
Figure 21B:
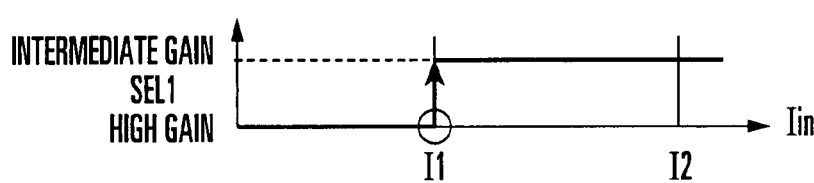
FIG. 21B is a graph which explains the operation characteristics of the gain switching comparator, and shows a change in the logic level of a first gain switching signal.
Figure 21C:
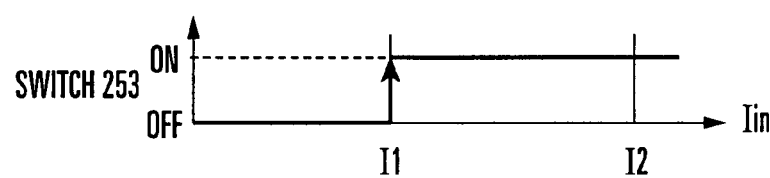
FIG. 21C is a graph which explains the operation characteristics of the gain switching comparator, and shows a change in the state of a switch 253.
Figure 21D:
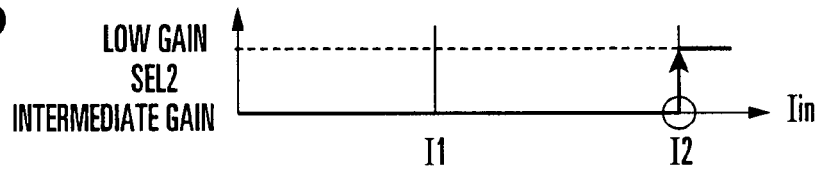
FIG. 21D is a graph which explains the operation characteristics of the gain switching comparator, and shows a change in the logic level of a second gain switching signal.
Figure 21E:
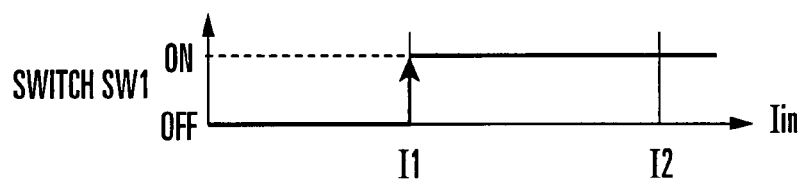
FIG. 21E is a graph which explains the operation characteristics of the gain switching comparator, and shows a change in the state of a switch SW1.
Figure 21F:
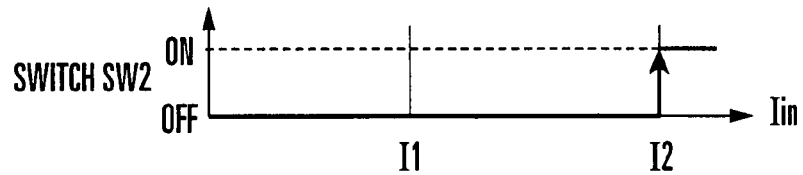
FIG. 21F is a graph which explains the operation characteristics of the gain switching comparator, and shows a change in the state of a switch SW2.
Figure 21G:
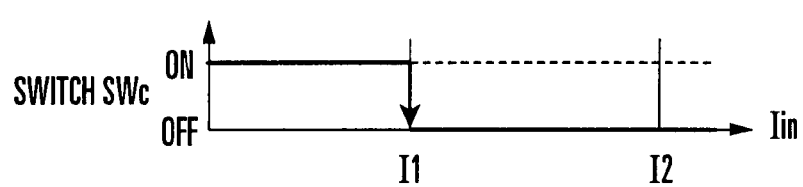
FIG. 21G is a graph which explains the operation characteristics of the gain switching comparator, and shows a change in the state of a switch SWc.
Figure 21H:
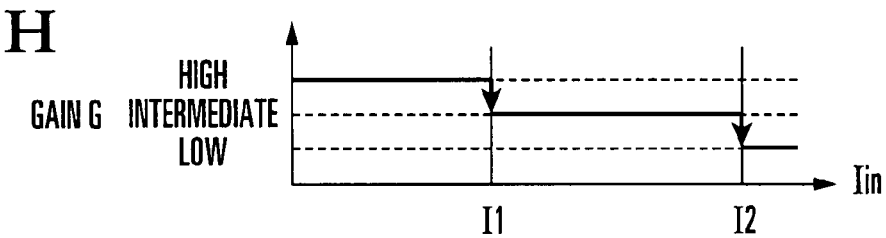
FIG. 21H is a graph which explains the operation characteristics of the gain switching comparator, and shows changes in the gains of first and second transimpedance amplifier core circuits.
Figure 22A:
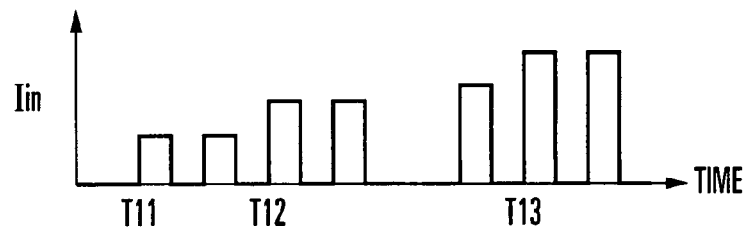
FIG. 22A is a timing chart showing an example of the operation of a transimpedance amplifier according to the sixth embodiment of the present invention, showing changes in input current with time.
Figure 22B:
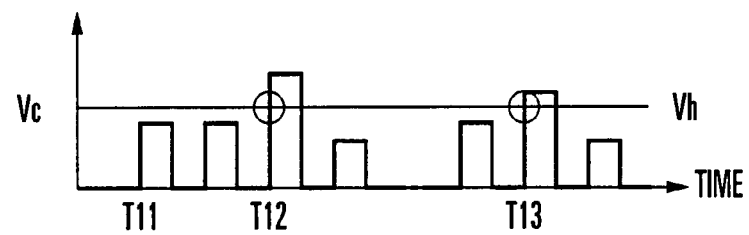
FIG. 22B is a timing chart showing an example of the operation of the transimpedance amplifier according to the sixth embodiment of the present invention, showing changes in comparative input voltage with time.
Figure 22C:
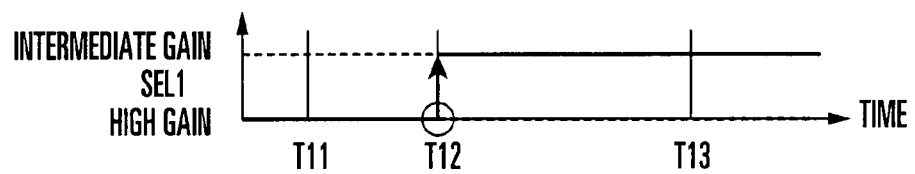
FIG. 22C is a timing chart showing an example of the operation of the transimpedance amplifier according to the sixth embodiment of the present invention, showing a change in the logic level of a first gain switching signal with time.
Figure 22D:
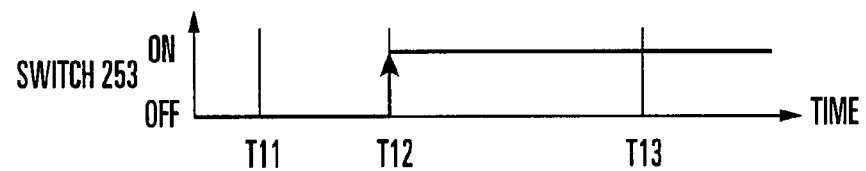
FIG. 22D is a timing chart showing an example of the operation of the transimpedance amplifier according to the sixth embodiment of the present invention, showing a change in the state of a switch 253 with time.
Figure 22E:
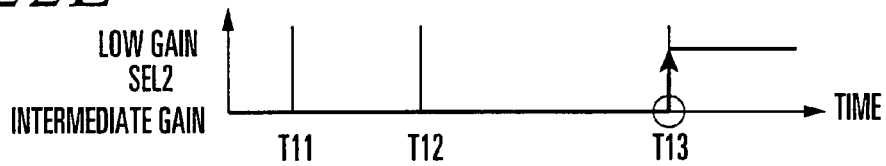
FIG. 22E is a timing chart showing an example of the operation of the transimpedance amplifier according to the sixth embodiment of the present invention, showing a change in the logic level of a second gain switching signal with time.
Figure 22F:
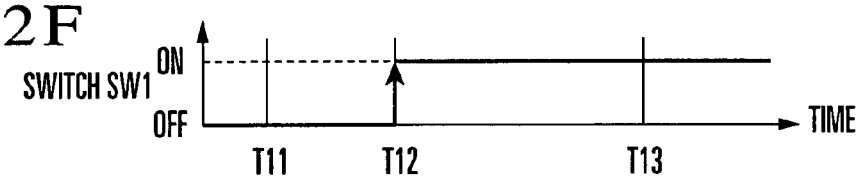
FIG. 22F is a timing chart showing an example of the operation of the transimpedance amplifier according to the sixth embodiment of the present invention, showing a change in the state of a switch SW1 with time.
Figure 22G:
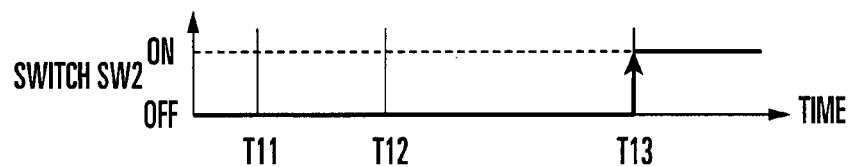
FIG. 22G is a timing chart showing an example of the operation of the transimpedance amplifier according to the sixth embodiment of the present invention, showing a change in the state of a switch SW2 with time.
Figure 22H:
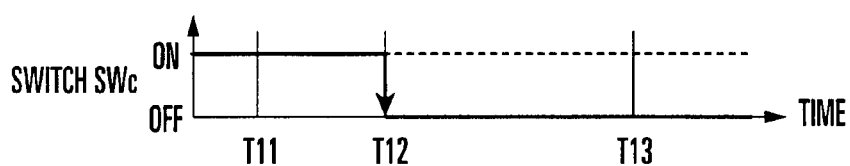
FIG. 22H is a timing chart showing an example of the operation of the transimpedance amplifier according to the sixth embodiment of the present invention, showing a change in the state of a switch SWc with time.
Figure 22I:
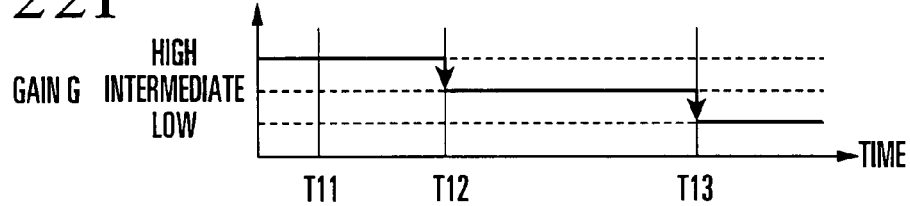
FIG. 22I is a timing chart showing an example of the operation of the transimpedance amplifier according to the sixth embodiment of the present invention, showing changes in the gains of first and second transimpedance amplifier core circuits with time.

As shown in FIG. 20, as compared with a second transimpedance amplifier core circuit 220D described in the fifth embodiment, a second transimpedance amplifier core circuit 220E used in the sixth embodiment includes a gain switching circuit 222A in place of the gain switching circuit 222, and also includes a filter circuit 225A in place of the filter circuit 225.

The gain switching circuit 222A has the same arrangement as that of the gain switching circuit 212A used in the first transimpedance amplifier core circuit 220A described in the second embodiment. Sequentially turning on switches SW1 and SW2 in accordance with a first gain switching signal SEL1 and a second gain switching signal SEL2 will reduce the feedback resistance value stepwise, thereby making the gain shift as follows: "high gain"→"intermediate gain"→"low gain".

The filter circuit 225A comprises a series connection circuit of a capacitive element C and a switch SWc. The switch SWc connects/disconnects one connection terminal of the capacitive element C and the signal input terminal 221A of the amplification circuit 221 in accordance with the gain of the second transimpedance amplifier core circuit 220E which is switched in accordance with the logic levels of the first and second gain switching signals SEL1 and SEL2. Note that the switch SWc may be configured to connect/disconnect at least one of the connection terminals of the capacitive element C and an amplification circuit 221.

The gain switching determination circuit 250A (see FIG. 9) described in the second embodiment inputs the first and second gain switching signals SEL1 and SEL2 to the second transimpedance amplifier core circuit 220E.

The operation of the transimpedance amplifier according to this embodiment will be described next with reference to FIGS. 21A to 21H and 22A to 22I. The following will describe a case wherein the filter circuit 225A operates only when the gain of each of the first and second transimpedance amplifier core circuits 210A and 220E is maximum, and does not operate when the gain is not maximum.

As shown in FIGS. 21A to 21H, in the interval in which the input current Iin increases and reaches a current value I1, i.e., the initial state, since a comparative input voltage Vc is lower than a voltage detection level Vh, the first gain switching signal SEL1 indicates the logic level corresponding to "high gain". In accordance with this logic level, a switch 253 is controlled in the OFF state, and a gain switching comparator 252 does not receive the comparative input voltage Vc. For this reason, the second gain switching signal SEL2 indicates the logic level corresponding to "intermediate gain". Therefore, the switches SW1 and SW2 of the gain switching circuits 212A and 222A are turned off to select "high gain".

In addition, when the first gain switching signal SEL1 turns on the switch SWc, the capacitive element C connects between a signal input terminal 221A and signal output terminal 221B of the amplification circuit 221, and the filter circuit 225A operates. When this selects "high gain", the high frequency band of the frequency characteristics of the second transimpedance amplifier core circuit 220E is reduced, and the signal band of a reference voltage, i.e., an output voltage V2, is reduced, thereby implementing a transimpedance amplifier having low-noise characteristics.

Subsequently, when an input current Iin increases and reaches the current value I1, the comparative input voltage Vc reaches the voltage detection level Vh. A gain switching comparator 251 then rises to switch the logic level of the first gain switching signal SEL1 from "high gain" to "intermediate gain". This controls the switch SW1 of each of the gain switching circuits 212A and 222A in the ON state to reduce the feedback resistance value, thereby selecting "intermediate gain".

In addition, the gain switching signal SEL1 turns off the switch SWc to disconnect the capacitive element C from between the signal input terminal 221A and signal output terminal 221B of the amplification circuit 221. As a consequence, the filter circuit 225A is set in the OFF state. With this operation, when a gain other than "high gain" is selected, the frequency characteristics of the second transimpedance amplifier core circuit 220E are not decreased.

Subsequently, when the input current Iin increases and reaches a current value 12, the comparative input voltage Vc reaches the voltage detection level Vh again. The gain switching comparator 252 then rises to switch the logic level of the second gain switching signal SEL2 from "intermediate gain" to "low gain". This controls the switch SW2 of each of the gain switching circuits 212A and 222A in the ON state to further decrease the feedback resistance value and select "low gain".

In addition, the first gain switching signal SEL1 keeps the switch SWc in the OFF state and disconnects the capacitive element C from between the signal input terminal 221A and signal output terminal 221B of the amplification circuit 221 to keep the filter circuit 225A in the OFF state. With this operation, when a gain other than "high gain" is selected, the frequency characteristics of the second transimpedance amplifier core circuit 220E are not decreased.

As shown in FIGS. 22A to 22I, therefore, in the interval between the instant at which the reception of a packet starts at time T11 and the instant at which the comparative input voltage Vc reaches the voltage detection level Vh, the first gain switching signal SEL1 from the gain switching comparator 251 indicates "high gain", and the second gain switching signal SEL2 indicates "intermediate gain". Therefore, the switches SW1 and SW2 are turned off to set the gains of first and second transimpedance amplifier core circuits 210 and 220 to "high gain". In addition, the switch SWc is turned off to connect the filter circuit 225A, thereby decreasing the frequency characteristics of the second transimpedance amplifier core circuit 220E.

Subsequently, when the input current Iin increases and the comparative input voltage Vc reaches the voltage detection level Vh at time T12, the first gain switching signal SEL1 from the gain switching comparator 251 inverted from "high gain" to "intermediate gain". This turns on the switch SW1 to set the gains of the first and second transimpedance amplifier core circuits 210A and 220E to "intermediate gain". As a consequence, the comparative input voltage Vc decreases. In addition, the switch SWc is turned off to disconnect the filter circuit 225A, and the frequency characteristics of the second transimpedance amplifier core circuit 220E are not decreased.

When the input current Iin increases afterward and the comparative input voltage Vc reaches the voltage detection level Vh at time T13, the second gain switching signal SEL2 from the gain switching comparator 252 is inverted from "intermediate gain" to "low gain". This turns on the switch SW2 to set the gains of the first and second transimpedance amplifier core circuits 210A and 220E to "low gain". In addition, since the switch SWc is OFF, the filter circuit 225A is disconnected. Therefore, the frequency characteristics of the second transimpedance amplifier core circuit 220E are not decreased.

As described above, this embodiment controls the switch SWc of the filter circuit 225A of the transimpedance amplifier core circuit 220E by using the first gain switching signal SEL1 to operate the filter circuit 225A only when the gain switching circuit 222A has selected "high gain". For this reason, only when the gain is maximum, the high-frequency band of the frequency characteristics of the second transimpedance amplifier core circuit 220E can be reduced. This makes it possible to maintain the follow-up characteristic of the reference voltage, i.e., the output voltage V2, and maintain the instantaneous response characteristic of the transimpedance amplifier.

As in the fifth embodiment, the dummy core which generates a reference voltage, i.e., the second transimpedance amplifier core circuit 220D, additionally includes the filter circuit 225 to reduce the high-frequency band of the frequency characteristics of the dummy core and reduce the signal band of the reference voltage, i.e., the output voltage V2, thereby implementing a transimpedance amplifier having low-noise characteristics.

In the arrangement designed to switch the gains of the first and second transimpedance amplifier core circuits 210A and 220E in a plurality of steps as in this embodiment, the DC potential of the reference voltage also changes in accordance with gain switching.

When, therefore, the filter circuit is made to always operate in this arrangement, a change in reference voltage at the time of gain switching delays in accordance with the time constants of the capacitive element C and feedback resistor of the filter circuit. As a result, the follow-up characteristics of an output voltage Vout with respect to a change in the input current Iin to the transimpedance amplifier deteriorates.

In this embodiment, the filter circuit 225A operates only when the gains of the first and second transimpedance amplifier core circuits 210A and 220D are maximum. Therefore, when gain switching is performed, the capacitive element C of the filter circuit 225A disconnects, no delay occurs in a change in reference voltage at the time of gain switching. This makes it possible to improve the follow-up characteristics of the output voltage Vout with respect to a change in the input current Iin to the transimpedance amplifier and maintain the instantaneous response characteristic of the transimpedance amplifier.

The high-frequency components produced in a reference voltage due to noise are especially conspicuous when the gain is high. Therefore, operating the filter circuit only when the gain is maximum allows to obtain sufficient low-noise characteristics.

Note that this embodiment has exemplified the arrangement designed to control the switch SWc of the filter circuit 225A by using the first gain switching signal SEL1 in consideration of the fact that when the gain is other than the maximum gain, the first gain switching signal SEL1 indicates "intermediate gain". When, however, using an arrangement designed to make the first gain switching signal SEL1 indicate "high gain" when the gain is other than the maximum gain, it suffices to generate a signal indicating the maximum gain from each gain switching signal by using a logic circuit and control the switch SWc on the basis of the signal.

Seventh Embodiment

A concrete example of a second transimpedance amplifier core circuit used in a transimpedance amplifier according to the seventh embodiment of the present invention will be described with reference to FIG. 23.

Figure 23:
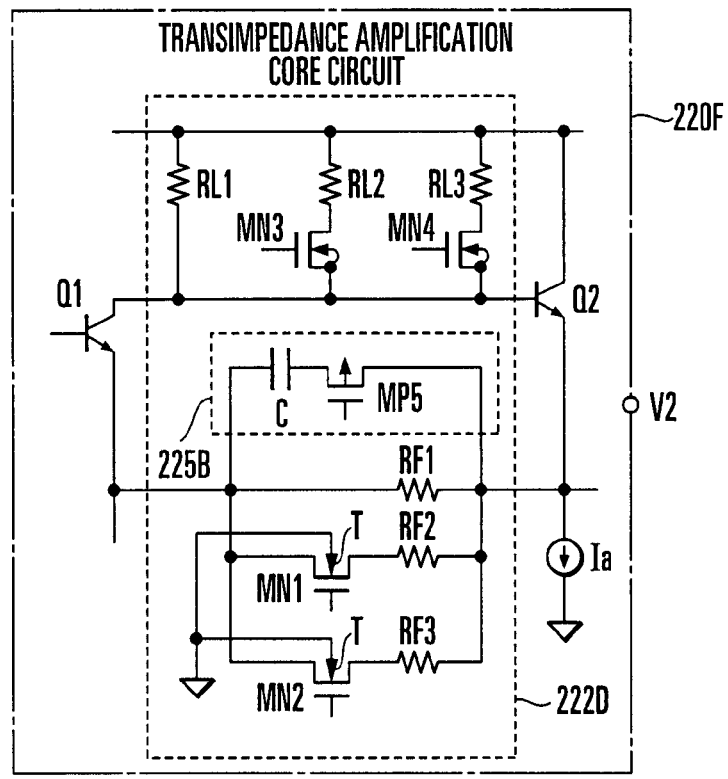
FIG. 23 is a circuit diagram showing an example of the arrangement of the main part of a second transimpedance amplifier core circuit used in a transimpedance amplifier according to the seventh embodiment of the present invention.

A second transimpedance amplifier core circuit 220F in FIG. 23 includes feedback resistors RF1, RF2, and RF3 which determine a transimpedance gain and load resistors RL1, RL2, and RL3 which determine an open loop gain, which constitute a gain switching circuit 222D designed to perform gain switching in two steps between "high gain", "intermediate gain", and "low gain". NMOS transistors NM1 to NM4 connect and disconnect the feedback resistors RF2 and RF3 and the load resistors RL2 and RL3 to switch to a desired feedback resistance value and a desired load resistance value. Note that PMOS transistors can also implement switches which switch feedback resistance values and load resistance values if the logic levels of gain switching signals are inverted.

The second transimpedance amplifier core circuit 220F further includes a filter circuit 225B. The filter circuit 225B comprises a series connection circuit of a capacitive element C and a PMOS transistor MP5 corresponding to a switch SWc. The PMOS transistor MP5 functions as a switch which connects/disconnects the capacitive element C. An NMOS transistor can also implement this switch if the logic level of a gain switching signal is inverted.

Note that as in the third embodiment, the substrate terminals of the NMOS transistors MN1 and MN2 used for switches which switch feedback resistance values may connect to ground potential (GND) instead of the source, and the substrate potential may be a potential lower than the source potential.

Eighth Embodiment

The arrangement of a transimpedance amplifier according to the seventh embodiment of the present invention will be described next with reference to FIGS. 24 and 25. Note that the same reference numerals as in FIG. 2 denote the same parts in FIG. 24.

Figure 24:
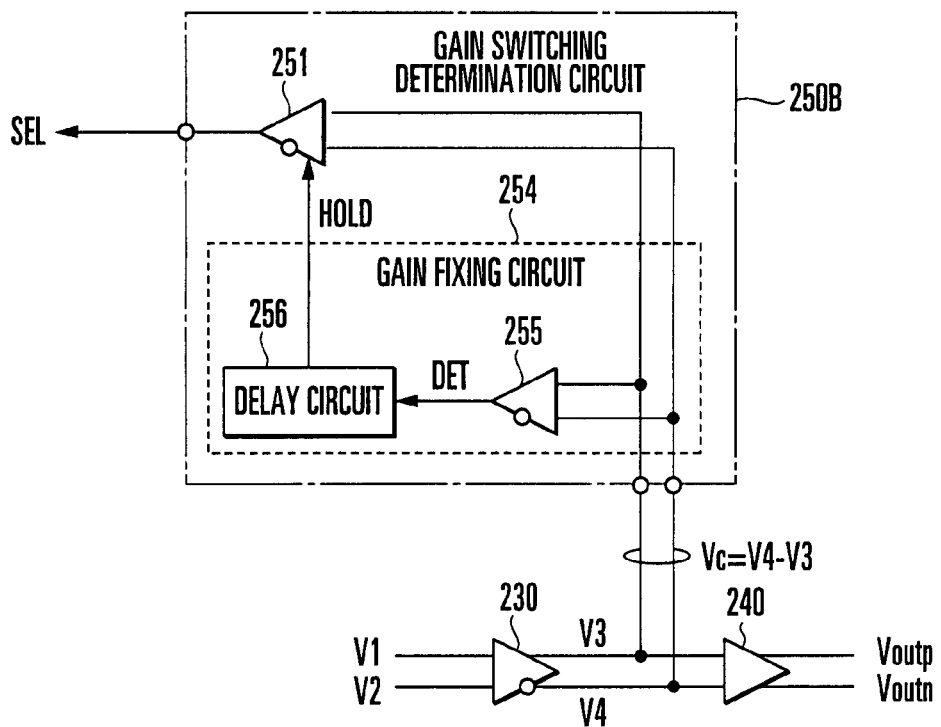
FIG. 24 is a block diagram showing the arrangement of a gain switching determination circuit used in a transimpedance amplifier according to the eighth embodiment of the present invention.

As compared with the transimpedance amplifier 200 according to the first embodiment, a transimpedance amplifier according to the eighth embodiment includes a gain switching determination circuit 250B shown in FIG. 24 in place of the gain switching determination circuit 250.

The gain switching determination circuit 250B receives a comparative input voltage Vc (=V4−V3) comprising output voltages V3 and V4 from an inter-stage buffer circuit 230, and performs the gain switching operation of switching the gains of first and second transimpedance amplifier core circuits 210 and 220 in accordance with an input current Iin from a light-receiving element 100 by outputting a gain switching signal SEL to gain switching circuits 212 and 222 of the first and second transimpedance amplifier core circuits 210 and 220 on the basis of the result obtained by comparing/determining the comparative input voltage Vc with a first hysteresis characteristic. In addition, the gain switching determination circuit 250B fixes the gains of the first and second transimpedance amplifier core circuits 210 and 220 by stopping the gain switching operation on the basis of the result obtained by comparing/determining the comparative input voltage Vc with a second hysteresis characteristic for detecting a voltage lower than that by the first hysteresis characteristic.

More specifically, the gain switching determination circuit 250B comprises a gain switching comparator 251 and a gain fixing circuit 254.

The gain switching comparator 251 is equivalent to the gain switching comparator 251 (see FIG. 2) described in the first embodiment. That is, the gain switching comparator 251 is a hysteresis comparator which has differential input terminals to which the differential output terminals of the inter-stage buffer circuit 230 connect and performs the gain switching operation of comparing/determining the comparative input voltage Vc (=V4−V3) input to the differential input terminals with the first hysteresis characteristic, and switching the gains of the transimpedance amplifier core circuits 210 and 220 by outputting the gain switching signal SEL from the output terminal in accordance with the comparison/determination result.

The gain fixing circuit 254 is a circuit which has input terminals to which the differential output terminals of the inter-stage buffer circuit 230 connect, compares/determines the comparative input voltage Vc input to the input terminal with the second hysteresis characteristic, stops the gain switching operation of the gain switching comparator 251 on the basis of the comparison/determination result, and fixes the gains of the first and second transimpedance amplifier core circuits 210 and 220.

The gain fixing circuit 254 further comprises a data detection comparator 255 and a delay circuit 256.

The data detection comparator 255 is a hysteresis comparator which has differential input terminals to which the differential output terminals of the inter-stage buffer circuit 230 connect, compares/determines the comparative input voltage Vc input to the differential input terminals with the second hysteresis characteristic, and detects whether data is received, by outputting a data detection signal DET corresponding to the comparison/determination result from the output terminal.

The delay circuit 256 is a circuit which includes an input terminal to which the output terminal of the data detection comparator 255 connects, and outputs, from its output terminal, a gain fixing signal HOLD for instructing to stop the gain switching operation of the gain switching comparator 251 by delaying the data detection signal DET from the data detection comparator 255, which is input to the input terminal, by a delay time Td. Using, as the delay time Td, a time length corresponding to the preamble set at the head of an uplink (from ONU to OLT) packet from each optical network unit makes it possible to permit only gain switching at the preamble while inhibiting gain switching at the succeeding payload.

Figure 25:
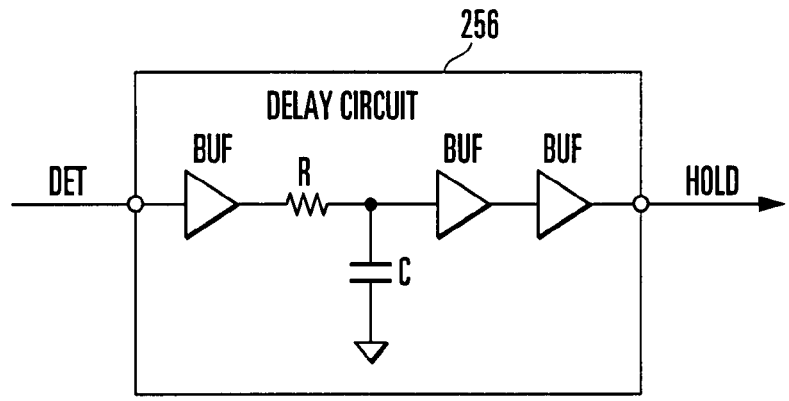
FIG. 25 is a circuit diagram showing a concrete example of a delay circuit.
Figure 26A:
FIG. 26A is a timing chart showing an example of the waveform of an input current.
Figure 26B:
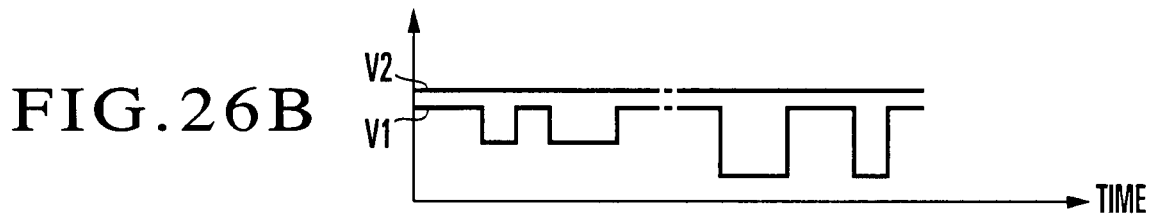
FIG. 26B is a timing chart showing examples of the waveforms of output voltages from first and second transimpedance amplifier core circuits.
Figure 26C:
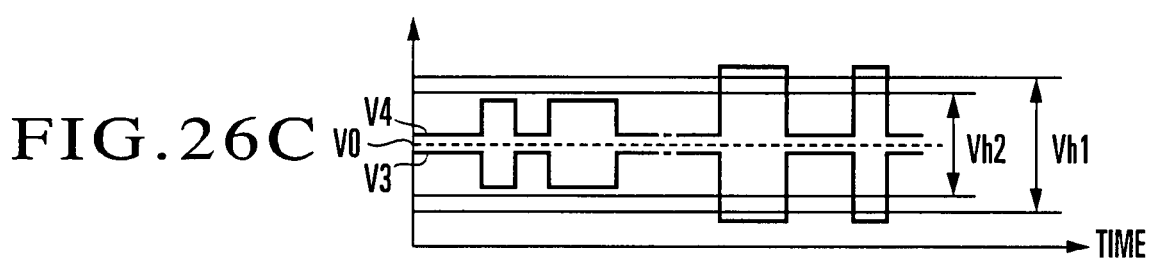
FIG. 26C is a timing chart showing examples of the waveforms of an inverted output voltage and a non-inverted output voltage from an inter-stage buffer circuit.
Figure 26D:
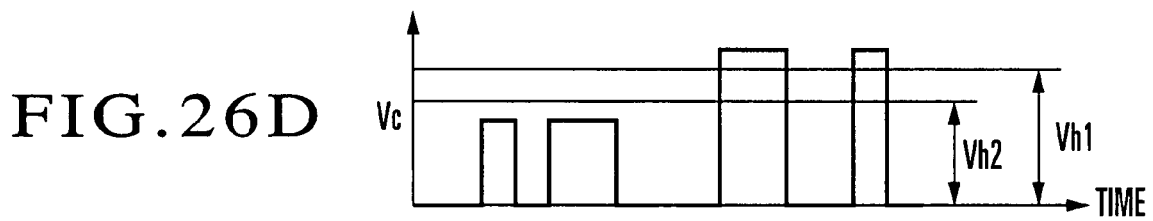
FIG. 26D is a timing chart showing an example of the waveform of a comparative input voltage to a gain switching comparator.

For example, as shown in FIG. 25, the delay circuit 256 can comprise an integration circuit comprising a resistive element R and a capacitive element C and gates (a buffer gate and an inverter) connecting to the input and output sides of the integration circuit. Note that the arrangement of the delay circuit is not limited to that shown in FIG. 25, and any of known techniques may be used.

The operation of the transimpedance amplifier according to this embodiment will be described next with reference to FIGS. 26A to 26D, 27A and 27B, 28A to 28C, and 29A to 29E. As is obvious from FIGS. 26A to 26D, the operations of the first transimpedance amplifier core circuit 210, the second transimpedance amplifier core circuit 220, the inter-stage buffer circuit 230, and an output buffer circuit 240 are the same as those in the first embodiment, and hence a description thereof will be omitted.

The operation of the gain switching determination circuit 250B will be described next with reference to FIGS. 27A and 27B, 28A to 28C, and 29A to 29E.

The inter-stage buffer circuit 230 supplies a differential output signal as the comparative input voltage Vc to the gain switching determination circuit 250B and inputs the signal to the gain switching comparator 251 and data detection comparator 255 of the gain switching determination circuit 250B.

Figure 27A:
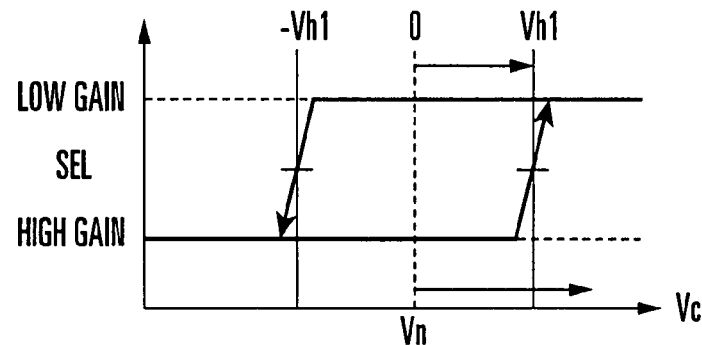
FIG. 27A is a graph showing an example of the hysteresis characteristic which the gain switching comparator has.
Figure 27B:
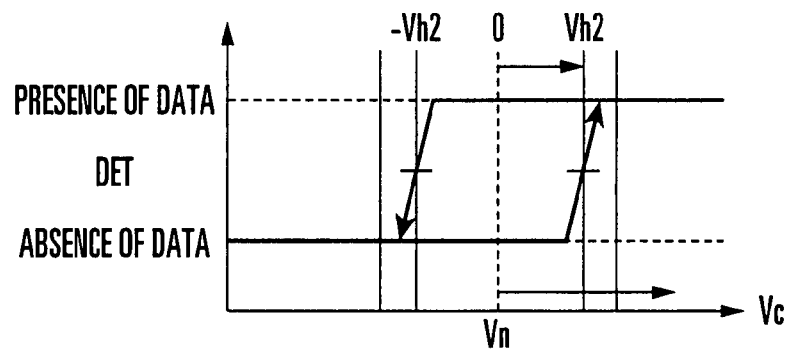
FIG. 27B is a graph showing an example of the hysteresis characteristic which a data detection comparator has.

As shown in FIG. 27A, the gain switching comparator 251 has a hysteresis characteristic (first hysteresis characteristic) which arises when the input voltage to the differential input terminals, i.e., the comparative input voltage Vc, exceeds a predetermined voltage detection level Vh1, and falls when the comparative input voltage Vc becomes lower than a voltage detection level −Vh1. As shown in FIG. 27B, the data detection comparator 255 has a hysteresis characteristic (second hysteresis characteristic) which arises when the input voltage to the differential input terminals, i.e., the comparative input voltage Vc, exceeds a predetermined voltage detection level Vh2, and falls when the comparative input voltage Vc becomes lower than a voltage detection level −Vh2. In this case, Vh1<Vh2.

In the arrangement of the transimpedance amplifier according to this embodiment, since the input current Iin is always input from the light-receiving element 100, output voltage V2>output voltage V1, and comparative input voltage Vc (=V4−V3)>0.

The gain switching comparator 251, which receives the comparative input voltage Vc as a differential input, compares the comparative input voltage Vc with the voltage detection level Vh1. When, therefore, the comparative input voltage Vc exceeds the voltage detection level Vh1, the logic level of an output from the gain switching comparator 251, i.e., the logic level of the gain switching signal SEL, is inverted. Since comparative input voltage Vc>0 and does not change to −Vh1, the logic level of the gain switching signal SEL which is inverted once is held. As described above, the gain switching comparator 251, which uses, as a reference voltage Vn, the comparative input voltage Vc set when the input current Iin is zero, uses only a hysteresis characteristic (rising region) with respect to the comparative input voltage Vc higher than the reference voltage Vn.

This embodiment initializes the logic level of the gain switching signal SEL to "high gain" before the reception of a packet, and switches the logic level of the gain switching signal SEL from "high gain" to "low gain" in accordance with rising operation in the hysteresis characteristic of the gain switching comparator 251. Note that it suffices to initialize the gain switching signal SEL by using a reset function to be described later.

The data detection comparator 255 compares the comparative input voltage Vc with the voltage detection level Vh2. As in the gain switching comparator 251, when the comparative input voltage Vc exceeds the voltage detection level Vh2, the logic level of an output from the data detection comparator 255, i.e., the logic level of the data detection signal DET, is inverted. The data detection comparator 255 also uses only a hysteresis characteristic (rising region) with respect to the comparative input voltage Vc higher than the reference voltage Vn.

This embodiment initializes the logic level of the data detection signal DET to "absence of data" before the reception of a packet, and switches the logic level of the data detection signal DET from "absence of data" to "presence of data" in accordance with the hysteresis characteristic of the data detection comparator 255. It suffices to initialize the data detection signal DET by using a reset function to be described later.

As shown in FIGS. 27A and 27B, this embodiment sets the voltage detection level Vh2 of the data detection comparator 255 to a voltage lower than the voltage detection level Vh1 of the gain switching comparator 251.

In the interval in which no packet is received, since the input current Iin is small, the voltage value of the comparative input voltage Vc is also small. With an increase in the input current Iin as the reception of a packet starts, the voltage value of the comparative input voltage Vc increases.

Figure 28A:
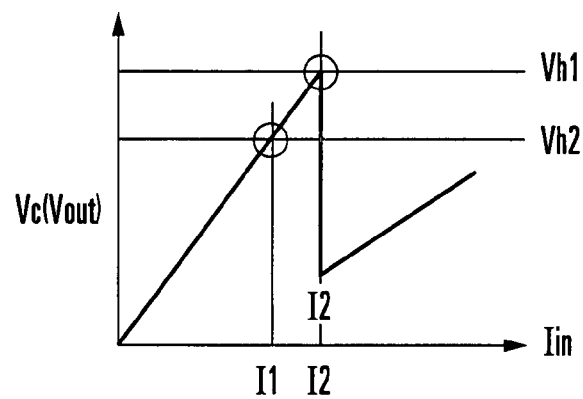
FIG. 28A is a graph which explains the operation characteristics of the gain switching comparator and data detection comparator, and shows the relationship between an input current and a comparative input voltage.
Figure 28B:
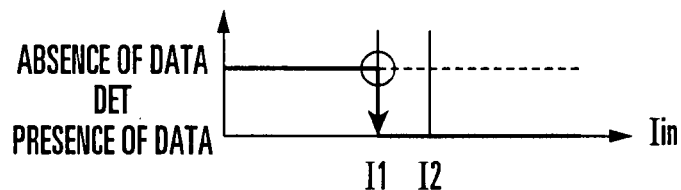
FIG. 28B is a graph which explains the operation characteristics of the gain switching comparator and data detection comparator, and shows a change in the logic level of a data detection signal.
Figure 28C:
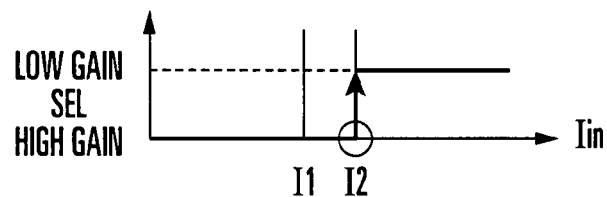
FIG. 28C is a graph which explains the operation characteristics of the gain switching comparator and data detection comparator, and shows a change in the logic level of a gain switching signal.
Figure 29A:
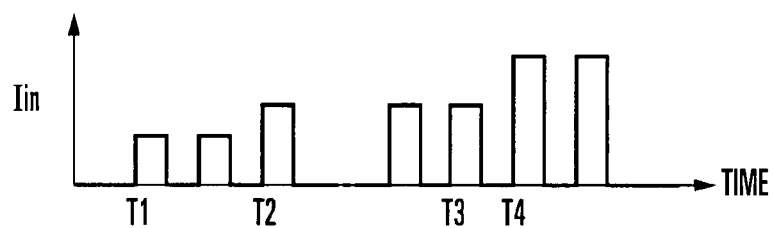
FIG. 29A is a timing chart showing an example of the operation of a transimpedance amplifier according to the eighth embodiment of the present invention, and changes in input current with time.
Figure 29B:
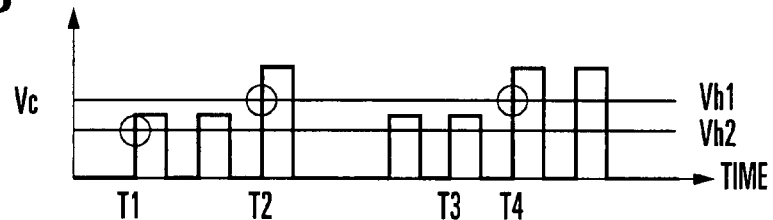
FIG. 29B is a timing chart showing an example of the operation of the transimpedance amplifier according to the eighth embodiment of the present invention, and changes in comparative input voltage with time.
Figure 29C:
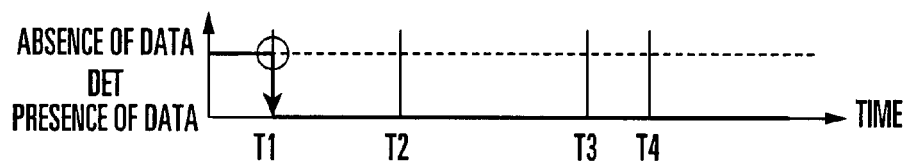
FIG. 29C is a timing chart showing an example of the operation of the transimpedance amplifier according to the eighth embodiment of the present invention, and a change in the logic level of a data detection signal with time.
Figure 29D:
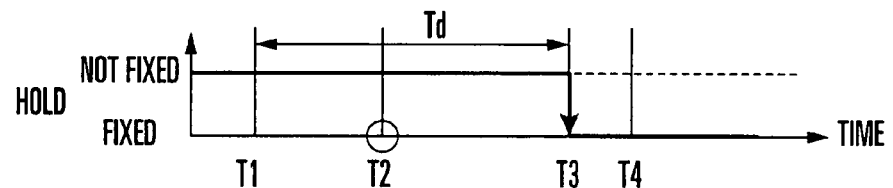
FIG. 29D is a timing chart showing an example of the operation of the transimpedance amplifier according to the eighth embodiment of the present invention, and a change in the logic level of a gain fixing signal with time.
Figure 29E:
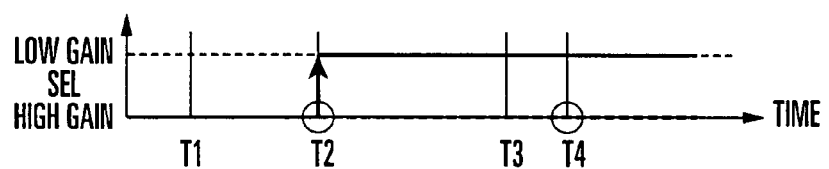
FIG. 29E is a timing chart showing an example of the operation of the transimpedance amplifier according to the eighth embodiment of the present invention, and a change in the logic level of a gain switching signal with time.

As shown in FIGS. 28A to 28C, therefore, when the input current Iin reaches the current value I1, the comparative input voltage Vc reaches the voltage detection level Vh2, and the data detection comparator 255 rises to switch the logic level of the data detection signal DET from "absence of data" to "presence of data". When the input current Iin further increases and reaches the current value 12 afterward, the comparative input voltage Vc reaches the voltage detection level Vh1, and the gain switching comparator 251 rises to switch the logic level of the gain switching signal SEL from "high gain" to "low gain". This reduces the gains of the first and second transimpedance amplifier core circuits 210 and 220. As a consequence, the output voltage Vout from the transimpedance amplifier and the comparative input voltage Vc decrease.

As shown in FIGS. 29A to 29E, therefore, when the input current Iin increases as the reception of a packet starts and the comparative input voltage Vc reaches the voltage detection level Vh2 at time T1, the data detection signal DET from the data detection comparator 255 is inverted from "absence of data" to "presence of data". The data detection comparator 255 inputs the data detection signal DET to the delay circuit 256, which delays the signal by the delay time Td and inputs it as the gain fixing signal HOLD to the gain switching comparator 251 at time T3. This stops the gain switching operation of the gain switching comparator 251. Subsequently, even when the comparative input voltage Vc reaches the voltage detection level Vh1, the gain switching signal SEL is not inverted.

When the input current Iin further increases after time T1 and the comparative input voltage Vc reaches the voltage detection level Vh1 at time T2 before time T3, the gain switching signal SEL from the gain switching comparator 251 is inverted from "high gain" to "low gain". This decreases the gains of the first and second transimpedance amplifier core circuits and 210 and 220.

In contrast, when the comparative input voltage Vc reaches the voltage detection level Vh1 at time T4 after time T3, since the gain switching comparator 251 has received the gain fixing signal HOLD at time T3, the gain switching signal SEL is not inverted from "high gain" to "low gain". With this operation, even if the input current Iin increases after time T3, the gains of the first and second transimpedance amplifier core circuits 210 and 220 are held, thereby outputting the stable output voltage Vout.

As described above, this embodiment determines, by using the second hysteresis characteristic lower in voltage detection level than the first hysteresis characteristic, whether it is necessary to fix gains, and hence can fix the gains of the first and second transimpedance amplifier core circuits 210 and 220, as needed, before determining whether it is necessary to switch the gains, thereby obtaining stability in gain switching.

In addition, the delay circuit 256 delays the data detection signal DET by the predetermined time Td to output the gain fixing signal HOLD for instructing to stop the gain switching operation. Therefore, adjusting the delay time Td makes it possible to fix the gains at a point of time after the lapse of an arbitrary period of time from the start of the reception of packet data, i.e., the head of a preamble. Using, as the delay time Td, a time length corresponding to the preamble set at the head of an uplink (from ONU to OLT) packet from each optical network unit, in particular, makes it possible to permit only gain switching at the preamble and inhibit gain switching at the succeeding payload.

Ninth Embodiment

Figure 30:
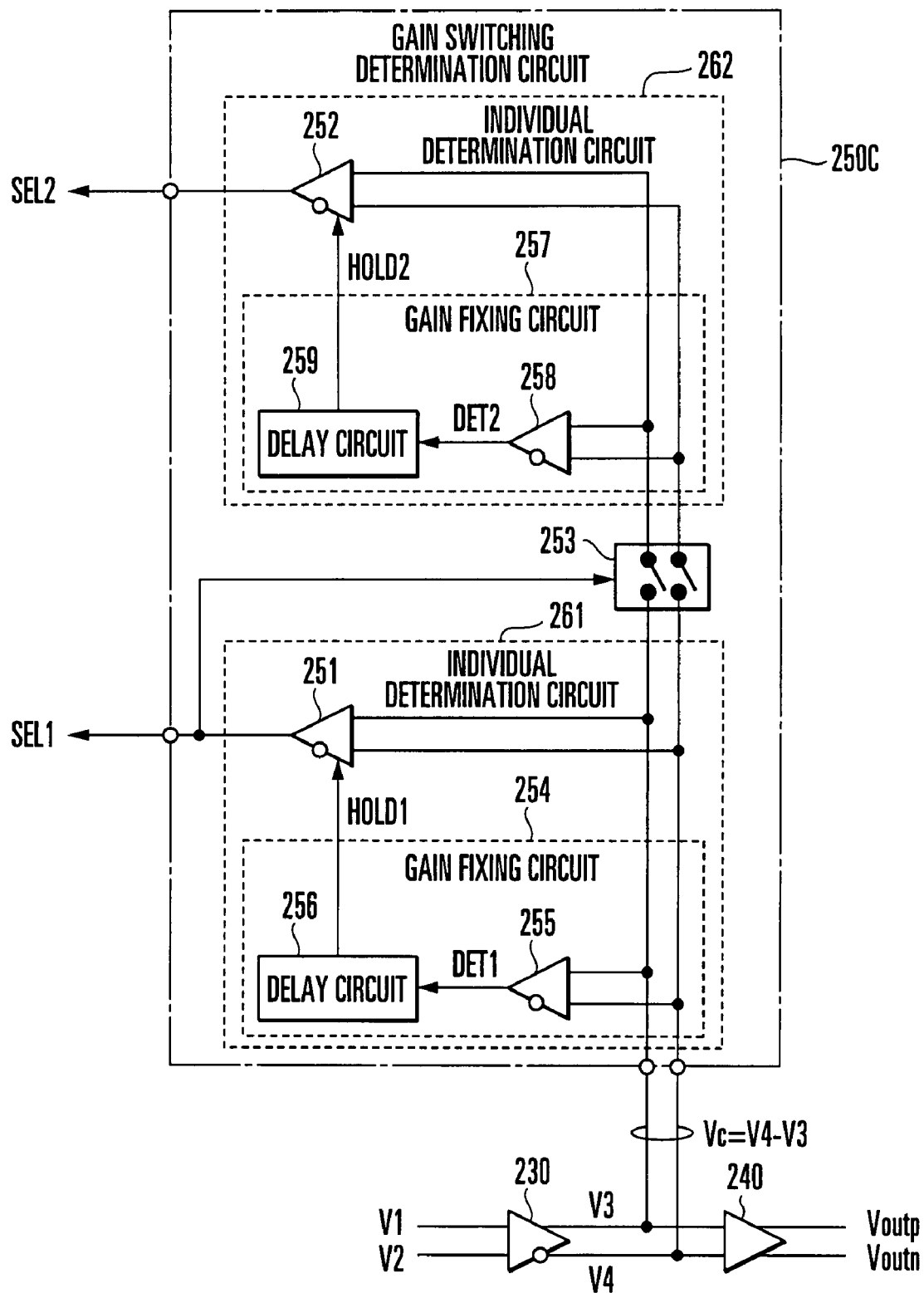
FIG. 30 is a block diagram showing the arrangement of a gain switching determination circuit used in a transimpedance amplifier according to the ninth embodiment of the present invention.
Figure 31A:
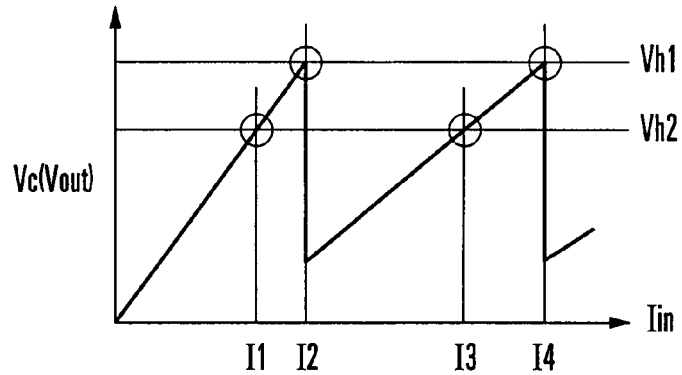
FIG. 31A is a graph which explains the operation characteristics of a gain switching comparator and data detection comparator, and shows the relationship between an input current and a comparative input voltage.
Figure 31B:
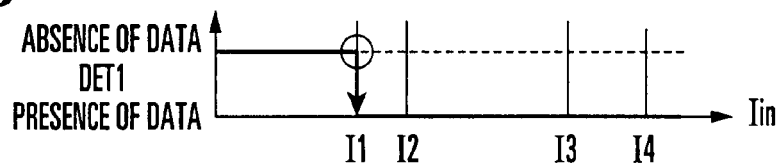
FIG. 31B is a graph which explains the operation characteristics of the gain switching comparator and data detection comparator, and shows a change in the logic level of a first data detection signal.
Figure 31C:
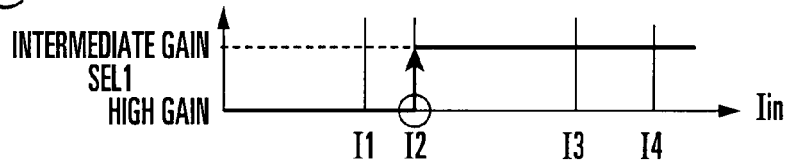
FIG. 31C is a graph which explains the operation characteristics of the gain switching comparator and data detection comparator, and shows a change in the logic level of a first gain switching signal.
Figure 31D:
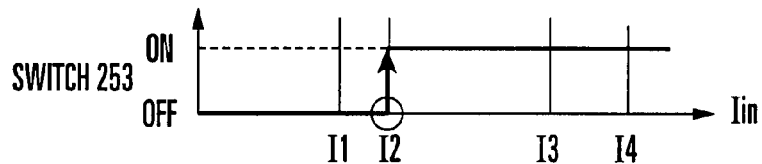
FIG. 31D is a graph which explains the operation characteristics of the gain switching comparator and data detection comparator, and shows a change in the state of a switch 253.
Figure 31E:
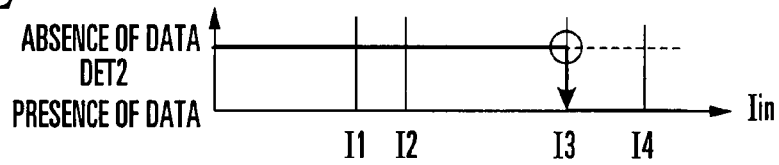
FIG. 31E is a graph which explains the operation characteristics of the gain switching comparator and data detection comparator, and shows a change in the logic level of a second data detection signal.
Figure 31F:
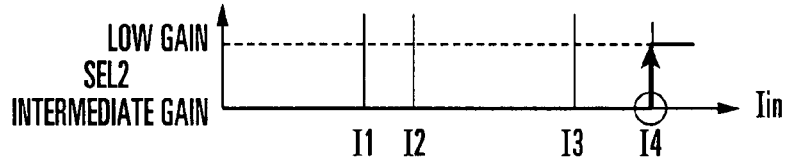
FIG. 31F is a graph which explains the operation characteristics of the gain switching comparator and data detection comparator, and shows a change in the logic level of a second gain switching signal.
Figure 34:
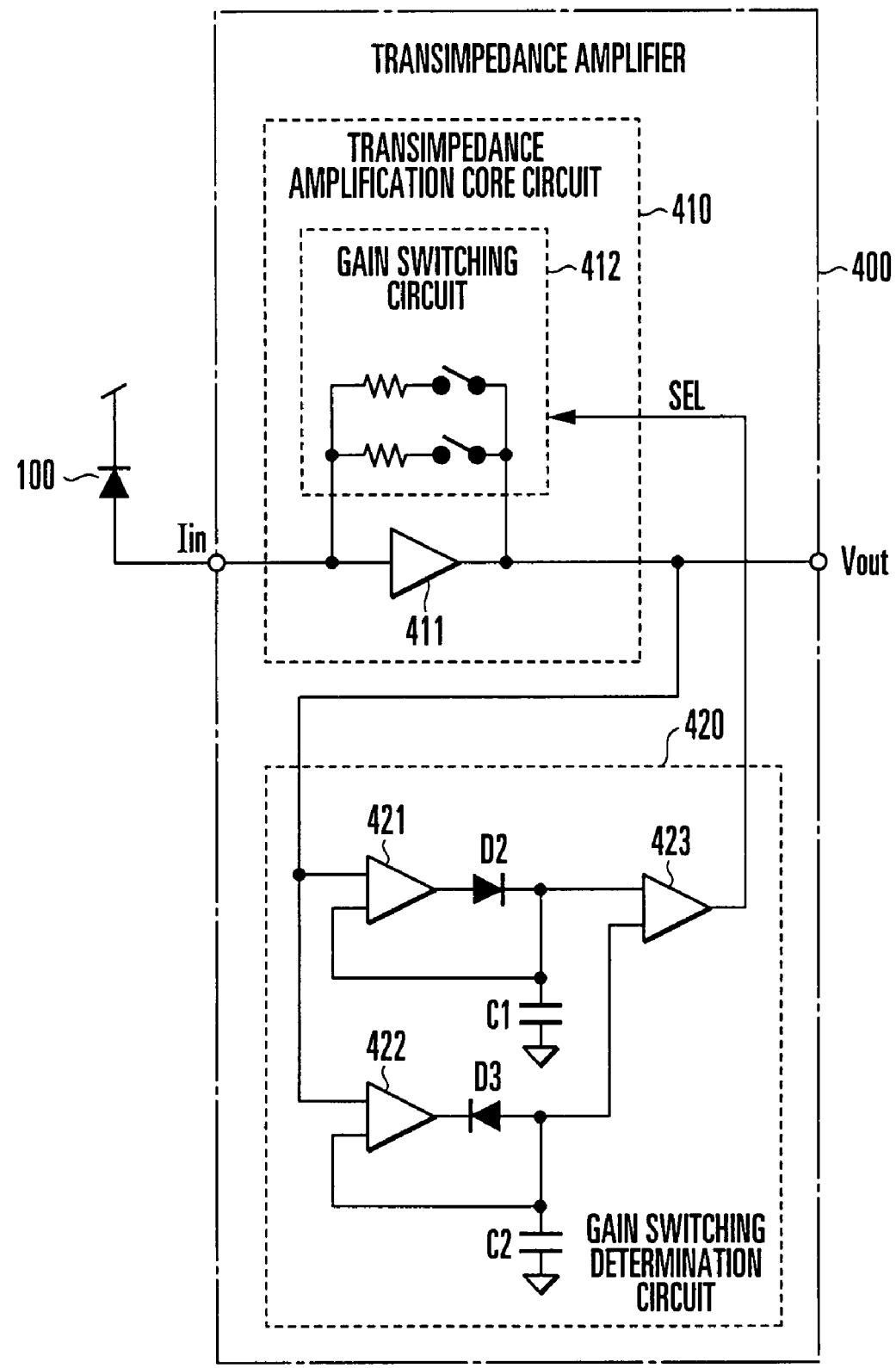
FIG. 34 is a circuit diagram showing the basic arrangement of another conventional transimpedance amplifier.

A transimpedance amplifier according to the ninth embodiment of the present invention will be described next with reference to FIG. 3. The same reference numerals as in FIGS. 2, 9, and 24 denote the same parts in FIG. 30.

The eighth embodiment has exemplified the case wherein the transimpedance amplifier core circuits 210 and 220 perform gain switching in one step between "high gain" and "low gain". The ninth embodiment will exemplify a case wherein transimpedance amplifier core circuits 210A and 220A perform gain switching in a plurality of steps, more specifically, two steps between "high gain", "intermediate gain", and "low gain".

As compared with a gain switching determination circuit 250B described in the eighth embodiment, a gain switching determination circuit 250C used in this embodiment includes an individual determination circuit 262 comprising a gain switching comparator 252 and a gain fixing circuit 257 and a switch 253 in addition to an individual determination circuit 261 comprising a gain switching comparator 251 and a gain fixing circuit 254. Of these components, the individual determination circuit 262 is identical to the individual determination circuit 261.

The switch 253 is a switch circuit provided between the differential output terminals of an inter-stage buffer circuit 230, the differential input terminals of the gain switching comparator 252, and the differential input terminals of a data detection comparator 258 connecting in parallel therewith. The output terminal of the gain switching comparator 251 connects to the switching control input terminal of the switch 253. The switch 253 operates from "OFF" to "ON" when the logic level of a first gain switching signal SEL1 output from the gain switching comparator 251 is inverted from "high gain" to "intermediate gain", thereby supplying a comparative input voltage Vc to the differential input terminals of the gain switching comparator 252 and data detection comparator 258.

The gain switching comparator 252 is a hysteresis comparator which has differential input terminals to which the differential output terminals of the inter-stage buffer circuit 230 connect, compares/determines the comparative input voltage Vc input to the differential input terminals with the first hysteresis characteristic, and performs the gain switching operation of switching the gains of the transimpedance amplifier core circuits 210A and 220A from "intermediate gain" to "low gain" by outputting a second gain switching signal SEL2 corresponding to the comparison/determination result.

The gain fixing circuit 257 is a circuit which has input terminals to which the differential output terminals of the inter-stage buffer circuit 230 connect, compares/determines the comparative input voltage Vc input to the input terminal with the second hysteresis characteristic, stops the gain switching operation of the gain switching comparator 252 on the basis of the comparison/determination result, and fixes the gains of the first and second transimpedance amplifier core circuits 210A and 220A.

The gain fixing circuit 257 further comprises the data detection comparator 258 and a delay circuit 259.

The data detection comparator 258 is a hysteresis comparator which includes differential input terminals to which the differential output terminals of the inter-stage buffer circuit 230 connect through the switch 253, compares/determines the comparative input voltage Vc input to the differential input terminals with the second hysteresis characteristic, and detects whether it is necessary to stop the gain switching operation of the gain switching comparator 252, by outputting a data second detection signal DET2 corresponding to the comparison/determination result.

The delay circuit 259 is a circuit which includes an input terminal to which the output terminal of the data detection comparator 258 connects, and outputs, from its output terminal, a second gain fixing signal HOLD2 for instructing to stop the gain switching operation of the gain switching comparator 252 by delaying the second data detection signal DET2 from the data detection comparator 258, which is input to the input terminal, by a delay time Td2. As a concrete example of the delay circuit 259, any of conventional techniques such as the arrangement shown in FIG. 25 may be used.

Using, as the delay time Td2, a time length corresponding to the preamble set at the head of an uplink (from ONU to OLT) packet from each optical network unit makes it possible to permit only gain switching at the preamble while inhibiting gain switching at the succeeding payload.

The operation of the transimpedance amplifier according to this embodiment will be described next with reference to FIGS. 31A to 31F.

As shown in FIGS. 31A to 31F, when the input current Iin reaches the current value I1, the comparative input voltage Vc reaches a voltage detection level Vh2. A data detection comparator 255 then rises to switch the logic level of a first data detection signal DET1 from "absence of data" to "presence of data". When the input current Iin further increases and reaches a current value I2 afterward, the comparative input voltage Vc reaches a voltage detection level Vh1. The gain switching comparator 251 then rises to switch the logic level of the gain switching signal SEL1 from "high gain" to "intermediate gain".

This decreases the gains of the first and second transimpedance amplifier core circuits 210A and 220A. As a consequence, an output voltage Vout from the transimpedance amplifier or the comparative input voltage Vc decreases.

When the logic level of the first gain switching signal SEL1 is switched from "high gain" to "intermediate gain", the switch 253 turns on to supply the comparative input voltage Vc to the gain switching comparator 252 and the data detection comparator 258.

When an input current Iin further increases and reaches a current value I3 afterward, the comparative input voltage Vc reaches the voltage detection level Vh2 again. The data detection comparator 258 rises to switch the logic level of the second data detection signal DET2 from "absence of data" to "presence of data". When the input current Iin further increases and reaches a current value I4 afterward, the comparative input voltage Vc reaches the voltage detection level Vh1 again. The gain switching comparator 252 then rises to switch the logic level of the second gain switching signal SEL2 from "intermediate gain" to "low gain".

This further decreases the gains of the first and second transimpedance amplifier core circuits 210A and 220A. As a consequence, the output voltage Vout from the transimpedance amplifier and the comparative input voltage Vc further decrease.

In practice, delay circuits 256 and 259 output the gain fixing signals HOLD1 and HOLD2 to the gain switching comparators 251 and 252 upon delaying the signals by the delay times Td1 and Td2 from the inversion of the logic levels of the data detection signals DET1 and DET2. When, therefore, the gain switching comparators 251 and 252 receive the gain fixing signals HOLD1 and HOLD2 before the comparative input voltage Vc reaches the voltage detection level Vh2, the gain switching operation of the gain switching comparators 251 and 252 stops. This operation fixes the logic levels of the gain switching signals SEL1 and SEL2 and fixes the gains of the first and second transimpedance amplifier core circuits 210A and 220A.

As described above, in addition to the gain switching comparator 251, data detection comparator 255, and delay circuit 256 which comprise the gain switching determination circuit 250B of the eighth embodiment, the ninth embodiment includes the gain switching comparator 252, data detection comparator 258, and delay circuit 259 which are equivalent to them. When the logic level of the first gain switching signal SEL1 output from the gain switching comparator 251 is inverted, the switch 253 operates from "OFF" to "ON" to supply the comparative input voltage Vc to the differential input terminals of the gain switching comparator 252 and data detection comparator 258. This makes it possible to obtain the same function and effect of the eighth embodiment and switch the gains of the first and second transimpedance amplifier core circuits 210A and 220A in a plurality of steps.

Although this embodiment has exemplified the case wherein "high gain", "intermediate gain", and "low gain" are switched in two steps, the present invention is not limited to this. When switching is to be performed in three or more steps, it suffices to connect a necessary number of individual determination circuits in series through switches and ON/OFF-control each switch in accordance with a gain switching signal output from the preceding individual determination circuit.

In addition, this embodiment has exemplified the case wherein the individual determination circuits 261 and 262 use the same hysteresis characteristic, i.e., the same voltage detection level. However, the present invention is not limited to this. The respective individual determination circuits may use different hysteresis characteristics, i.e., different voltage detection levels.

10th Embodiment

A concrete example of a gain switching determination circuit used in a transimpedance amplifier according to the 10th embodiment of the present invention will be described next with respect to FIG. 32. In this embodiment, the reset function and output fixing function of each hysteresis comparator used as a gain switching comparator in each of gain switching determination circuits 250B and 250C will be described in detail.

The reset function of each gain switching comparator will be described first.

In each of gain switching comparators 251B and 252B in FIG. 32, reference symbols R1 to R6 denote resistors; Q3 to Q8, NPN transistors; MP1 and MP2, PMOS transistors; and Ia and Ib, current sources. Of these components, the PMOS transistors MP1 and MP2 constitute a reset circuit 270. The reset circuit 270 is identical to the reset circuit 270 described in the fourth embodiment, which is turned on by a reset signal RESET to forcibly restore the collector potentials of the transistors Q3 and Q4 to the initial value. This initializes the operation states of the gain switching comparators 251B and 252B.

The output fixing function of each gain switching comparator will be described next.

Gain switching comparators 251 and 252 of the gain switching determination circuits 250B and 250C need to stop gain switching operation based on the comparative input voltage Vc and fix the gain switching signals on the basis of the gain fixing signals HOLD from the delay circuits 256 and 259. In this embodiment, each of these gain switching comparators includes an output fixing circuit 271 which stops comparing operation and fixes an output on the basis of the externally input gain fixing signal HOLD.

In each of the gain switching comparators 251B and 252B in FIG. 32, the output fixing circuit 271 comprises PMOS transistors MP3 and MP4 which have gate terminals connecting to the hold terminal to which the gain fixing signal HOLD is input, and short-circuit the current supply resistors R1 and R2 to the transistors Q3 and Q4. The PMOS transistors MP3 and MP4 are turned on by the externally supplied gain fixing signal HOLD to fix the collector potentials of the transistors Q3 and Q4 and stop comparing operation. Note that inverting the logic level of a gain fixing signal makes it possible to use NMOS transistors in place of the PMOS transistors MP3 and MP4.

As described above, the output fixing circuit 271 in this embodiment can forcibly stop the comparing operation of the hysteresis comparator by using the externally supplied gain fixing signal HOLD. Even if, therefore, the comparative input voltage Vc changes with a change in the input current Iin, this embodiment can stop the gain switching operation of the gain switching comparators 251B and 252B which correspond to the comparative input voltage Vc, and fix the gain switching signal SEL, thereby obtaining stability in gain switching.

Note that the concrete arrangements of the reset circuit 270 and output fixing circuit 271 are not limited to those shown in FIG. 32, and other circuit arrangements may be used.

In addition, each of the data detection comparators 255 and 258 may include the reset circuit 270 which initializes an output by using the reset signal RESET and comprises a circuit arrangement equivalent to that of each of the gain switching comparators 251A and 252A (see FIG. 17). Note, however, that it is necessary to implement the second hysteresis characteristic having the voltage detection level Vh2 lower than the voltage detection level Vh1.

INDUSTRIAL APPLICABILITY

The transimpedance amplifier according to the present invention is suitable for an optical reception circuit which converts an optical signal into an electrical signal in an optical transmission circuit such as an optical transmission system, an optical interconnection, or a passive optical network system which allows high-speed data transmission.

The invention claimed is:

1. A transimpedance amplifier comprising:
   a first transimpedance amplifier core circuit which includes an input terminal and an output terminal, amplifies a current input to the input terminal with a desired gain, and outputs the signal as a voltage signal from the output terminal;
   a second transimpedance amplifier core circuit which has the same arrangement as that of said first transimpedance amplifier core circuit with an open input terminal;
   an inter-stage buffer circuit which differentially amplifies voltage signals output from said first transimpedance amplifier core circuit and said second transimpedance amplifier core circuit and outputs the signals as a differential output signal; and
   a gain switching determination circuit which receives the differential output signal output as a comparative input voltage from said inter-stage buffer circuit, and outputs a gain switching signal for switching gains of said first transimpedance amplifier core circuit and said second transimpedance amplifier core circuit on the basis of a result obtained by comparing/determining the comparative input voltage with a first hysteresis characteristic,
   wherein said first transimpedance amplifier core circuit and said second transimpedance amplifier core circuit switch gains on the basis of the gain switching signal output from said gain switching determination circuit.

2. A transimpedance amplifier according to claim 1, characterized in that said first transimpedance amplifier core circuit further comprises:
   a gain switching circuit which switches feedback resistance values on the basis of a gain switching signal output from said gain switching determination circuit, and
   an amplification circuit which connects in parallel with said gain switching circuit, amplifies a current input to the input terminal with a gain determined by a feedback resistance value of said gain switching circuit, and outputs the current as a voltage signal from the output terminal.

3. A transimpedance amplifier according to claim 2, characterized in that said gain switching circuit comprises a MOS transistor as a switch which switches feedback resistance values.

4. A transimpedance amplifier according to claim 3, characterized in that the MOS transistor comprises an NMOS transistor whose substrate terminal connects to ground whose potential is lower than a source potential.

5. A transimpedance amplifier according to claim 2, characterized in that said first transimpedance amplifier core circuit further comprises an open loop gain switching circuit which switches open loop gains upon switching of feedback resistance values of said gain switching circuit.

6. A transimpedance amplifier according to claim 1, characterized in that said gain switching determination circuit comprises a reset circuit which initializes an output from said gain switching determination circuit in accordance with an external control signal.

7. A transimpedance amplifier according to claim 1, characterized in that said second transimpedance amplifier core circuit further comprises a filter circuit which attenuates a high-frequency component of a voltage signal output from said second transimpedance amplifier core circuit.

8. A transimpedance amplifier according to claim 7, characterized in that said filter circuit comprises a capacitive element.

9. A transimpedance amplifier according to claim 7, characterized in that
   said first transimpedance amplifier core circuit further comprises a gain switching circuit which switches feedback resistance values on the basis of a gain switching signal output from said gain switching determination circuit, and an amplification circuit which includes a signal input terminal connecting to the input terminal and a signal output terminal connecting to the output terminal, connects in parallel with said gain switching circuit, amplifies a current input to the signal input terminal with a gain determined by a feedback resistance value of said gain switching circuit, and outputs the current as a voltage signal from the signal output terminal, and wherein said filter circuit comprises a capacitive element which includes two connection terminals with at least one of the connection terminals connecting to an amplification circuit of said second transimpedance amplifier core circuit.

10. A transimpedance amplifier according to claim 9, characterized in that the capacitive element connects between a signal input terminal and a signal output terminal of the amplification circuit of said second transimpedance amplifier core circuit.

11. A transimpedance amplifier according to claim 9, characterized in that the capacitive element connects between a signal input terminal of the amplification circuit of said second transimpedance amplifier core circuit, and a predetermined power supply potential.

12. A transimpedance amplifier according to claim 9, characterized in that the capacitive element connects between a signal output terminal of the amplification circuit of said second transimpedance amplifier core circuit, and a predetermined power supply potential.

13. A transimpedance amplifier according to claim 9, characterized in that the filter circuit further comprises a switch which opens at least one of the connection terminals of the capacitive element on the basis of the gain switching signal output from said gain switching determination circuit.

14. A transimpedance amplifier according to claim 9, characterized in that the filter circuit further comprises a switch which opens at least one of the connection terminals of the capacitive element except when said gain switching circuit selects a feedback resistance value by which a gain of said second transimpedance amplifier core circuit is maximized.

15. A transimpedance amplifier according to claim 13, characterized in that the switch comprises a MOS transistor.

16. A transimpedance amplifier according to claim 1, characterized in that said gain switching determination circuit comprises a gain switching comparator which switches gains of said first transimpedance amplifier core circuit and said second transimpedance amplifier core circuit by outputting a gain switching signal in accordance with a result obtained by comparing/determining a comparative input voltage with the first hysteresis characteristic, and a gain fixing circuit which fixes gains of said first transimpedance amplifier core circuit and said second transimpedance amplifier core circuit by stopping gain switching operation of the gain switching comparator on the basis of a result obtained by comparing/determining a comparative input voltage with a second hysteresis characteristic lower than the first hysteresis characteristic.

17. A transimpedance amplifier according to claim 16, characterized in that the gain fixing circuit comprises a data detection comparator which outputs a data detection signal in accordance with a result obtained by comparing/determining a comparative input voltage with the second hysteresis characteristic, and a delay circuit which instructs to stop gain switching operation of the in switching comparator by delaying a data detection signal output from the data detection comparator by a predetermined time, and the gain switching comparator comprises an output fixing circuit which fixes a gain switching signal by stopping gain switching operation in accordance with a gain fixing signal output from the delay circuit.

18. A transimpedance amplifier according to claim 17, characterized in that the gain switching comparator comprises a reset circuit which initializes an output from the gain switching comparator in accordance with an external control signal, and the data detection comparator comprises a reset circuit which initializes an output from the data detection comparator in accordance with an external control signal.

* * * * *

UNITED STATES PATENT AND TRADEMARK OFFICE
CERTIFICATE OF CORRECTION

| | | |
|---|---|---|
| PATENT NO. | : 7,868,701 B2 | Page 1 of 1 |
| APPLICATION NO. | : 11/658688 | |
| DATED | : January 11, 2011 | |
| INVENTOR(S) | : Nakamura et al. | |

It is certified that error appears in the above-identified patent and that said Letters Patent is hereby corrected as shown below:

Column 34, Claim 17, at line 27, delete "in" and insert -- gain --.

Signed and Sealed this
Sixteenth Day of August, 2011

David J. Kappos
*Director of the United States Patent and Trademark Office*